US007244961B2

(12) United States Patent
Jovanovich et al.

(10) Patent No.: US 7,244,961 B2

(45) Date of Patent: Jul. 17, 2007

(54) INTEGRATED SYSTEM WITH MODULAR MICROFLUIDIC COMPONENTS

(75) Inventors: Stevan B. Jovanovich, Livermore, CA (US); Iuliu Blaga, Fremont, CA (US); Roger McIntosh, Scotts Valley, CA (US)

(73) Assignee: Silicon Valley Scientific, Dublin, CA (US)

( * ) Notice: Subject to any disclaimer, the term of this patent is extended or adjusted under 35 U.S.C. 154(b) by 344 days.

(21) Appl. No.: 11/050,423

(22) Filed: Feb. 2, 2005

(65) Prior Publication Data

US 2005/0161669 A1 Jul. 28, 2005

Related U.S. Application Data

(63) Continuation-in-part of application No. 10/633,171, filed on Aug. 1, 2003, now Pat. No. 6,870,185.

(60) Provisional application No. 60/400,634, filed on Aug. 2, 2002, provisional application No. 60/436,286, filed on Dec. 23, 2002, provisional application No. 60/541,473, filed on Feb. 2, 2004.

(51) Int. Cl.

| | |
|---|---|
| ***H01L 23/34*** | (2006.01) |
| ***C25D 17/00*** | (2006.01) |

(52) U.S. Cl. ........................ 257/48; 257/712; 257/713; 257/714; 204/400; 204/451; 204/452; 204/453

(58) Field of Classification Search .................... None
See application file for complete search history.

(56) References Cited

U.S. PATENT DOCUMENTS 6,342,142 B1 * 1/2002 Ramsey ...................... 204/453
2005/0150766 A1 * 7/2005 Manz et al. ................ 204/452

FOREIGN PATENT DOCUMENTS

DE 19917330 A1 10/2000
WO WO 2004/012862 A 2/2004

OTHER PUBLICATIONS

Darling, R.B., "Development of a high density, planar, modular microfluidic interconnect system," Transducers '01 Eurosensors XV. 11th International Conference on Solid-State Sensors and Actuators, Munich, Germany, Jun. 10-14, 2001, pp. 974-977.

* cited by examiner

*Primary Examiner*—Jasmine Clark
(74) *Attorney, Agent, or Firm*—Heller Ehrman LLP

(57) ABSTRACT

Modular fluidic microchips, systems integrating such microchips, and associated preparative and analytical methods are presented.

32 Claims, 19 Drawing Sheets

PREPARATION

PUMP MATRIX INTO A, SUCTION OUT C, W, S & A
ADD SAMPLE TO SI PORT

REACTION

SUCTION OUT S, ADD LIQUID TO C, W, S & A
PERFORM REACTION

ANALYSIS

MOVE SAMPLE INTO S
PERFORM INJECTION & SEPARATION

LEGEND

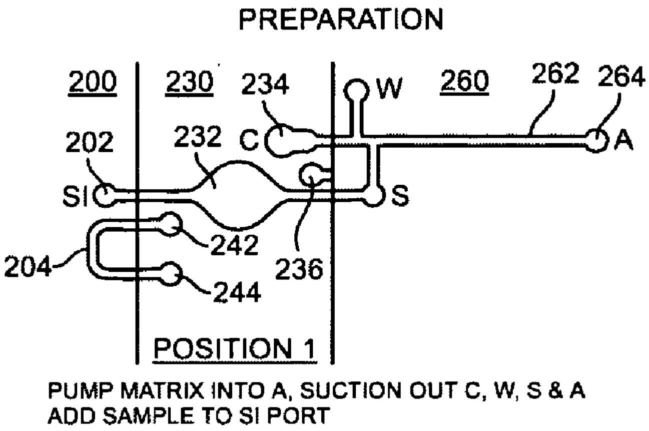
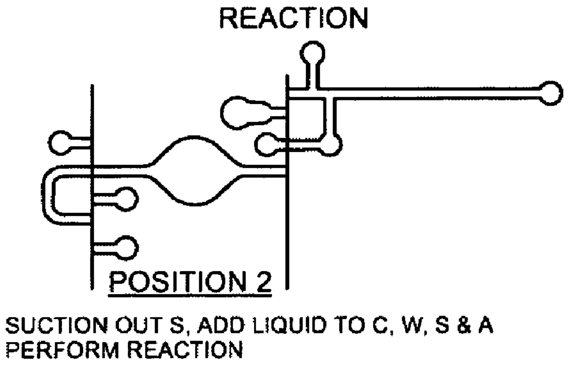
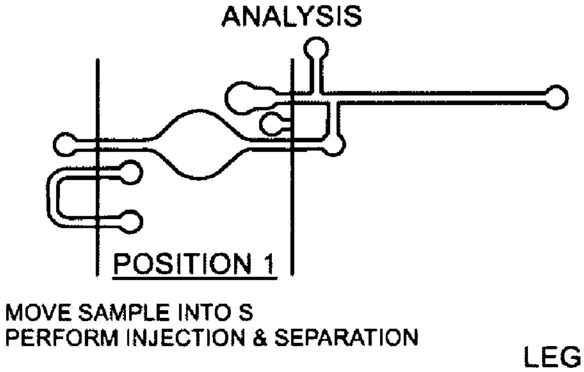
FIG. 2
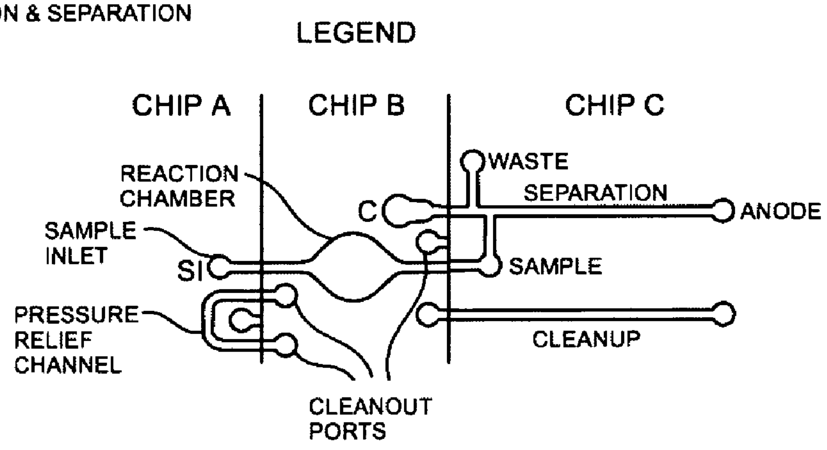

VALVES FOR MICROCHIPS
(ROTARY)

VALVES FOR MICROCHIPS

INTEGRATED SYSTEM WITH MODULAR MICROFLUIDIC COMPONENTS

CROSS-REFERENCE TO RELATED APPLICATIONS

This application claims the benefit of U.S. provisional application Ser. No. 60/541,473, filed Feb. 2, 2004, and is also a continuation-in-part of U.S. patent application Ser. No. 10/633,171, filed Aug. 1, 2003, now U.S. Pat. No. 6,870,185, which claims the benefit of U.S. provisional application Ser. No. 60/436,286, filed Dec. 23, 2002, and 60/400,634, filed Aug. 2, 2002, the disclosures of which are incorporated herein by reference in their entireties.

BACKGROUND OF THE INVENTION

Microfluidics consist of using microchannels instead of test tubes or microplates to carry out analyses and reactions. These microchannels or microcircuits are fabricated into silicon, quartz, glass, ceramics or plastic. The size of these channels is on the order of micrometers, while the reaction volumes are on the order of nanoliters or microliters. The principle of a microfluidic device is to guide reaction media containing reagents and samples through zones which correspond to the different steps of the protocol. The integration into a single system of reactors, sample treatment, separation, and miniature detection systems into these microfluidic systems allows the automation of complex protocols. These "laboratories on chips" have made it possible to obtain results which are efficient in terms of reaction speed, in terms of product economy, and in terms of miniaturization, which allows the development of portable devices. Complex protocols have been integrated and automated, including biochemical or molecular biology protocols which often require extensive manipulation. These manipulations include mixing reagents and samples, controlling the reaction temperature, carrying out thermal cycling, sample clean up, separation by electrophoresis, and detection of reaction products.

Wolley et al. (*Anal. Chem.* 68: 4081-4086 (1996)) discloses the integration of a PCR microreactor, a capillary electrophoresis system and a detector in a single device. The PCR reaction, separation of PCR products by electrophoresis, and detection of PCR products are carried out automatically. This device does not, however, integrate the mixing of reagents, and it does not allow large scale protocols to be performed.

A device or substrate allowing integration of the steps of reagent mixing and enzymatic reaction has been described by Hadd et al. (*Anal. Chem.* 69:3407-3412, (1997)). This device provides a microcircuit of channels and reservoirs etched into a glass substrate. The moving and mixing of the fluids takes place by electrokinetics.

Microfluidic systems for the integration of protocols and of analyses have been described in international patent application WO 98/45481. One of the difficulties in implementing these devices resides in the movement of the fluids. The fluids are generally moved by electroosmosis or by electrokinetics, which requires a network of electrodes and fluid continuity. Other systems use micropumps and microvalves which are integrated in the microfluidic substrate. In the majority of cases the reactions are carried out while stationary in a microreactor and then the fluids are thus moved from one reactor to another at each step of the protocol. These systems which integrate electrodes, microvalves or micropumps are very costly and their complexity does not allow large scale applications for simultaneously treating a very large number of samples. One of the major difficulties is the distribution, mixing and transport of a very large number of products in parallel or in series.

Thus, there exists a need for devices which allow for manipulation of samples or the performance of complex protocols in which the samples are transported from one location to another using methods other than that is known in the art, and that are simple, reliable and at a low cost. There is also a need to develop a device comprising a microfluidic substrate allowing the manipulation of a large number of fluids and/or allowing a large number of complex protocols, particularly protocols involving temperature treatment, to be carried out at a low cost.

SUMMARY OF THE INVENTION

The present invention solves these, and other needs in the art, by providing fluidic microchips and other structures, systems, apparatus and methods that facilitate the integration and/or isolation of various functions in a modular fluidic microchip system.

In a first aspect, the invention provides an integrated fluidic microchip system. The system comprises a plurality of fluidic microchips, each containing at least one capillary channel, each biased towards, and reversibly sealed to, at least one other of the microchips, creating an interface therebetween. The system further comprises means for moving at least a first of said plurality of microchips with respect to at least a second microchip to which it is reversibly sealed, wherein at least one of the capillary channels in the first and/or second microchip can be connected or disconnected across the interface by the relative movement. Typically, but not invariably, the relative movement of the reversibly sealed chips is linear.

In a first embodiment, integration of the functions is achieved by a multi-chip, sliding linear valve approach. The chips are edge joined and fluidic contact is established by connection of capillary channels at the joining edges. The chips are so designed that connection of the different channels can be achieved by the sliding of the microchips against each other. Sliding can also disrupt channel connection where desired. The chips are in continued physical contact throughout the process.

In a second embodiment, the chips are separated and rejoined to establish/disrupt channel connection. The basic design of the microchip is still the same as in the first embodiment. The 'jogging' approach reduces wear at the joining edges. Specific surface coatings for the joining edges that help prevent leakage and keep liquid in the capillary channels are disclosed.

Another embodiment is related to miniature valves. Several designs are disclosed, including both linear and rotary valves in top contact with the microchip, as well as linear, edge-contact sliding valves. A method to fabricate very small, high aspect ratio holes in glass is also disclosed, which facilitates the use of the miniature, low volume valves.

In another aspect, the invention provides an integrated fluidic microchip system, as above-described, further comprising means for reversibly segregating one or more of said microchips in fluidic discontinuity from all others of said plurality of microchips. The reversible segregating means allow a serial preparative and/or analytical process to be deconvoluted into a process that includes at least one parallel process step.

In another aspect, the invention provides fluidic microchips useful in the systems of the present invention. The microchip has at least one capillary channel, and is capable of reversibly sealing, upon application of a biasing force, to at least one other such microchip, forming a chip-chip interface. The chips are so designed as to permit relative movement between a first and second such reversibly sealed microchips, wherein at least one of the capillary channels in the first and/or second microchip can be connected or disconnected across the interface by the relative movement.

In another aspect, the invention provides apparatus for reversibly integrating a plurality of modular fluidic microchips, each containing at least one capillary channel, into a fluidically communicating system.

The apparatus comprises means for biasing each of a plurality of microchips towards at least one other of the microchips with sufficient bias to create a fluidically sealed interface therebetween, and means for linearly moving at least a first of the plurality of microchips with respect to at least a second microchip to which it is reversibly sealed, wherein at least one of the capillary channels in the first and/or second microchip can be connected or disconnected across the interface by the relative movement.

In various embodiments, the apparatus further comprises means for reversibly segregating one or more of the microchips in fluidic discontinuity from all others of the plurality of microchips. The reversible segregating means allow a serial preparative and/or analytical process to be deconvoluted into a process that includes at least one parallel process step.

In a further aspect, the invention provides methods for integrating modular microchips to create microfluidic systems having changeable fluidic pathways; in typical embodiments, the methods are practiced using apparatus of the present invention.

The modularity of the microchips in the systems and methods of the present invention provides several advantages. For example, the systems, microchips, methods and apparatus of the present invention:

- allow processes having different rates, cycle times, and throughputs to proceed independently;
- "integrate" individual microchips into more complex processes by docking microchips and transferring samples in a "plug-and-play" manner;
- create zero dead-volume valves and routers;
- segregate functionality onto separate components and microchips;
- enable disposable and non-disposable microchips to be used interchangeably as appropriate and/or desired;
- standardize interfaces to allow components to be independently developed and integrated at the system level;
- increase the repertoire of microchip operations to including docking and undocking in a "plug-and-play" manner.

The systems, microchips, and apparatus of the present invention can be applied to create microchips and other fluidic circuits that perform logically clustered groups of functions and can interact. Individual processes or sets of processes can be developed independently and inserted into a system using standard interfaces. Each process can proceed independently with different rates, cycle times, or throughputs and then be integrated by microfluidic transfer between devices. Complex processes can be performed by docking two devices and transferring samples from one device to the next device that has the next functionality.

The modular approach of the present invention also permits flexible, decision-based software-controlled sample processing and analysis, in contrast to the inflexible "hard integration" found on monolithic microchips that perform multiple functions.

Modular systems of the present invention can be built, extended, and improved one piece at a time without disrupting existing functional components, including apparatus of the invention. The systems, chips, methods, and apparatus of the present invention will simplify the development, deployment, and continual future improvements of biodetection and analysis systems.

Advantages of the modular approach include the ability to decouple or deconvolute serial processes into processes that include at least one parallel process step, an ability to form valves and routers from the edges of the microchips, and the ability to seamlessly mix disposable and non-disposable components.

BRIEF DESCRIPTION OF THE DRAWINGS

The above and other objects and advantages of the present invention will be apparent upon consideration of the following detailed description taken in conjunction with the accompanying drawings, in which like characters refer to like parts throughout, and in which:

FIG. 2 shows the design and exemplary working positions of a three chip system, similar to that shown in FIG. 1 but with additional features, according to the present invention;

DETAILED DESCRIPTION

Figure 1:
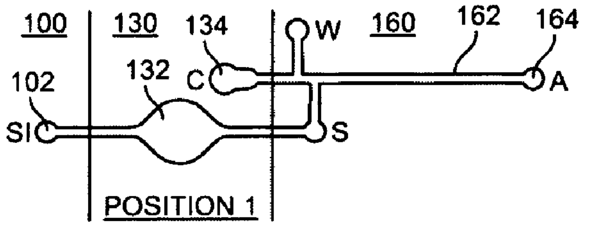
FIG. 1 shows the design and three of the working positions of a sliding linear valve system comprising three fluidic microchips, according to the present invention.
Figure 1:
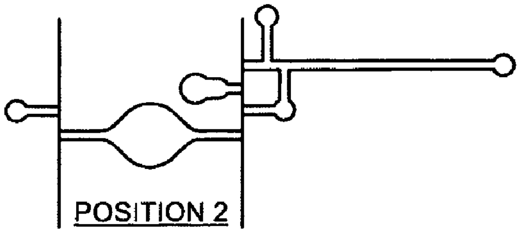
Figure 1:
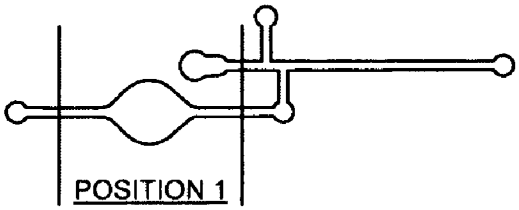
Figure 1:
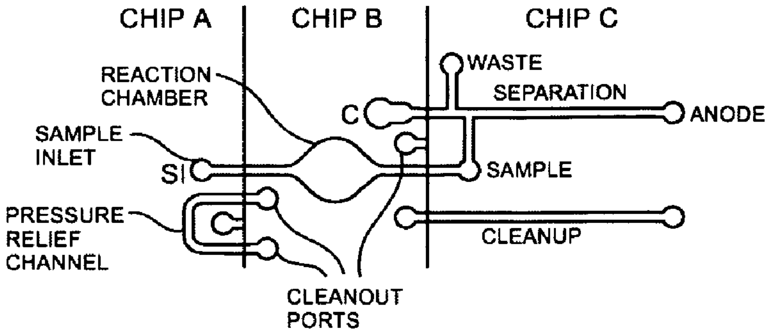

The present invention provides microfluidic devices and systems for integration and/or isolation of various functions in a fluidic microchip system and methods for using the same.

As used herein, the terms "fluidic microchip", "microfluidic chip", "microchip", and "chip" are synonymous and are used interchangeably.

The present invention will now be described with regard to the accompanying drawings which assist in illustrating various features of the invention. However, it should be appreciated that the drawings do not constitute limitations on the scope of the present invention. Throughout the drawings, like numbered items represent like elements of the invention. For the sake of brevity and clarity, most figures show only one set of microfluidic channels; however, it should be appreciated that typical microfluidic devices comprise multiple sets of microfluidic channels.

In a first aspect, the invention provides an integrated fluidic microchip system.

The system comprises a plurality of fluidic microchips.

Each of the plurality of microchips contains at least one capillary channel. Each of the plurality of microchips is biased towards, and reversibly sealed to, at least one other of the microchips, creating an interface therebetween; at pressures to be used in the system, the seal between and among microchips is fluid-tight.

The system further comprises means for linearly moving at least a first of the plurality of microchips with respect to at least a second microchip to which it is reversibly sealed; the movement is such that at least one of the capillary channels in the first and/or second microchip can be connected or disconnected across the interface by the relative movement of the first and second microchip.

The chips can be biased towards each other by any known means, including resilient biasing means, such as springs, and nonresilient biasing means, such as mechanically-, pneumatically- or hydraulically-driven means for applying force. Chips can also be biased towards each other by combinations of such biasing means, such as by a spring-loaded pneumatic.

In one series of embodiments, an edge of the first microchip is sealed to an edge of the second microchip (edge-sealed). In other embodiments, an edge of the first chip is sealed to a face of the second chip. In yet other embodiments, a face of the first chip is sealed to a face of the second chip. In embodiments in which at least one microchip edge contributes to the interface, at least one of the interfacing edges can be polished to facilitate creation of a seal, including low-pressure seal, at the mating surfaces. In other embodiments, further described below, at least one interfacing edge can be etched to create a protrusion ("mesa") that reduces the length of the interfacing edge, improving the seal.

In one series of embodiments, the integration and/or isolation of the various functions in a microchip system is achieved using a sliding linear approach, in which at least a first microchip is moved with respect to at least a second microchip along the axis of (that is, moved coaxially with) the interface therebetween. Often, the sliding movement is of insufficient magnitude to eliminate in its entirely the interface between the first and second microchip.

For example, in certain edge-sliding embodiments, the integration and/or isolation of various functions in a microchip system are achieved using a three-chip system. The system comprises three micro-fabricated chips, edge-joined, in fluid communication with each other. At least one of the chips is moveable, by sliding action, relative to at least one other of the three microchips, in order to redirect or seal the fluid paths. As noted above, at least one of the interfacing edges can be polished to facilitate creation of a low-pressure seal at the mating surfaces.

In a first example of such a three-chip system, shown in FIG. 1, a first chip (chip A, 100) contains a single sample inlet port 102. A second chip (chip B, 130) contains a reaction chamber 132 and a cathode port 134 while a third chip (chip C, 160) contains a standard separation channel 162 with a twin-tee/cross injector. In position 1 (all fluid paths connected), matrix is introduced into the anode port 164 of third chip 160 thereby filling the separation and injector regions. In typical use, this action would be followed by suction cleaning of the wells. Sample and reactants are added to the sample inlet port 102 of first chip 100 thereby filling reaction chamber 132 of second chip 130. The second chip is then moved to position 2 whereby the reaction chamber 132 is isolated from the rest of the device. Chemical/biological reactions, such as those further described below, are performed in reaction chamber 132. Following the reaction process, second chip 130 is returned to position 1 so that the reaction products can be moved into the third chip for injection and separation.

If the reaction process involves temperature changes, in particular temperature increases, leakage can occur at the chip interfaces if reaction chamber 132 is completely filled with fluid prior to temperature change. To avoid leakage, either chamber 132 can be under-filled, leaving a small air space for fluid expansion, or the design of the chamber-containing microchip can usefully be modified to include a small channel to provide pressure relief (see FIGS. 2-3).

In a second example of a three-chip system, shown in FIG. 2, a pressure relief channel 204 has been added, along with additional ports 236, 242, 244 to facilitate cleaning of the microchips. The initial process of filling with matrix and sample are performed as described above. Now, when the second chip (chip B, 230) is moved to position 2, the reaction chamber 232 is connected to the pressure relief channel 204 on one end and sealed on the other. The second end of the pressure relief channel is also sealed. The pressure relief channel is empty to start, and relieves the pressure built-up during reaction. Following the reaction, reaction product injection and separation are performed as in the first example, above.

Figure 3:
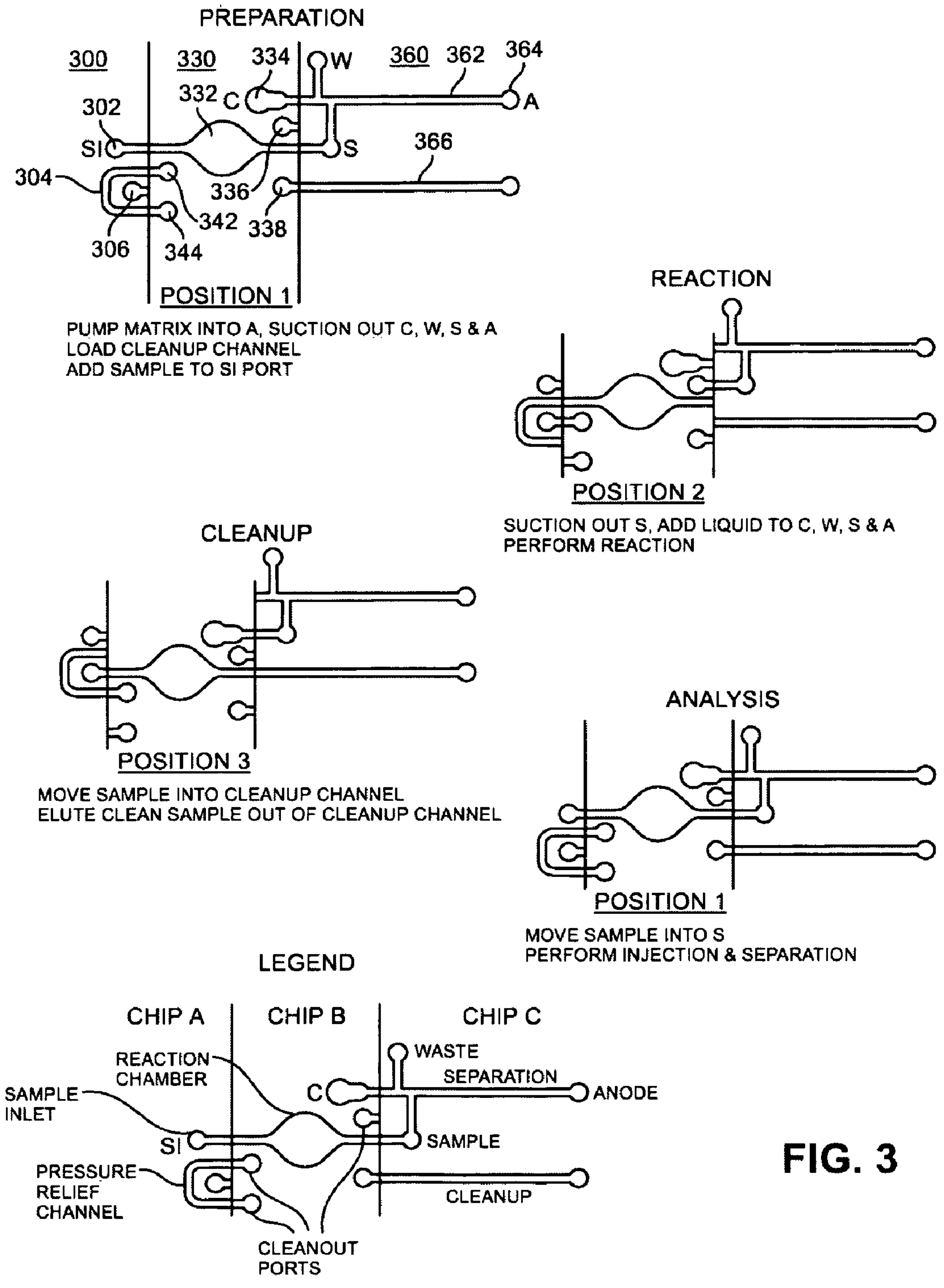
FIG. 3 shows the design and four of the working positions of a three chip system, similar to that shown in FIG. 2 but with additional features, according to the present invention.

In a third example of a three chip system, shown in FIG. 3, a sample cleanup channel 366 and ports 306, 336, 338, 342, 344 are added to facilitate cleaning the device. This sample cleanup channel can be surface modified, filled with a monolithic capture matrix, or filled with media such as capture beads (e.g., wall bound or magnetic) during the first steps of matrix and sample loading. Reaction products are again created with the second chip (chip B, 330) in position 2. Next, the second chip is moved to position 3 where the reaction chamber 332 is connected to the cleanup channel 366. The contents of the reaction chamber are moved into the cleanup channel where undesired products pass on through and out of the system. The desired reaction products are then released from the capture media and moved back into the reaction chamber 332. Lastly, the second chip is returned to position 1 for sample injection and separation.

Figure 15:
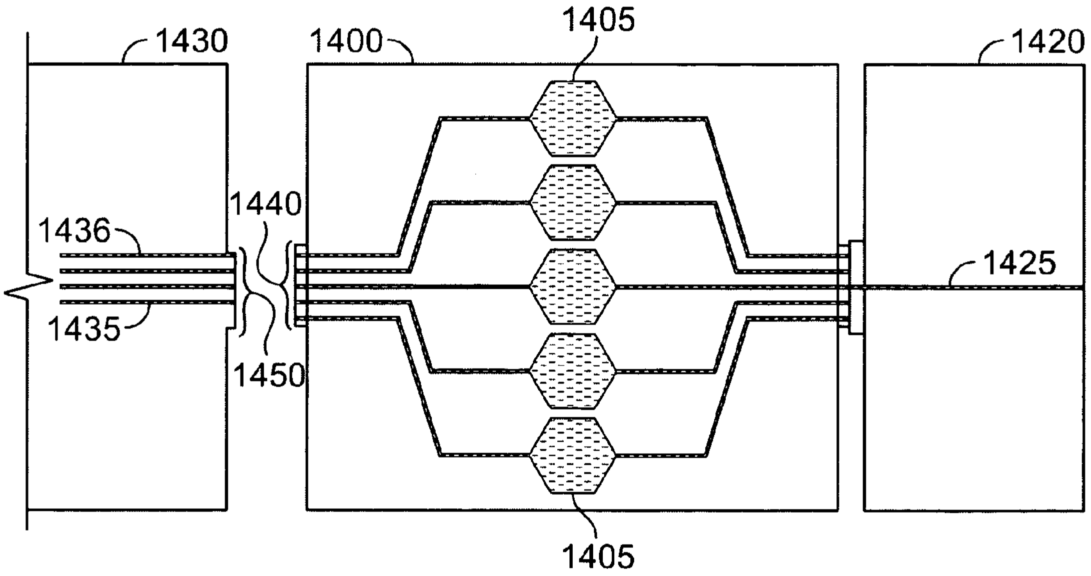
FIG. 15 shows a one-to-many (right to left) connection between two fluidic microchips, with a reduced contact area therebetween, according to the present invention.

FIG. 15 illustrates a further example of a modular three chip microfluidic system of the present invention.

As shown, microchip 1400 has two edges configured to interface with adjacent microchips; each of the contact edges is shaped to present a reduced surface area to the chip interface (see 1440 and 1450), to facilitate fluidic sealing, as described in greater detail below.

Microchip 1400 has a plurality of internal reaction/processing chambers 1405, thus permitting multiplexing of reactions within a single microchip of the present invention.

The operable interfacing of microchip 1420 to microchip 1400 effects a one-to-many connection. Single channel 1425 of microchip 1420 can, e.g., be a reagent supply channel, supplying reagent in parallel to reaction chambers 1405. Single channel 1425 can, in reverse, lead to a separation device, such a capillary electrophoresis device or mass spectrometer.

In the embodiment shown, operable interfacing of microchip 1400 to microchip 1430 effects a many-to-many connection. Plural channels 1436 of microchip 1430 can, e.g., deliver a plurality of samples in parallel to different ones of the plurality of reaction chambers 1405. Conversely, each of the plurality of reaction chambers 1405 can discharge reacted samples in parallel, without cross-contamination, through channels 1436 to detection devices or chips capable of effecting further separation, preparation, and/or analysis.

The number of channels on modular microchips of the present invention can readily be varied, from a single channel to a plurality of channels, as further described below.

Figure 16:
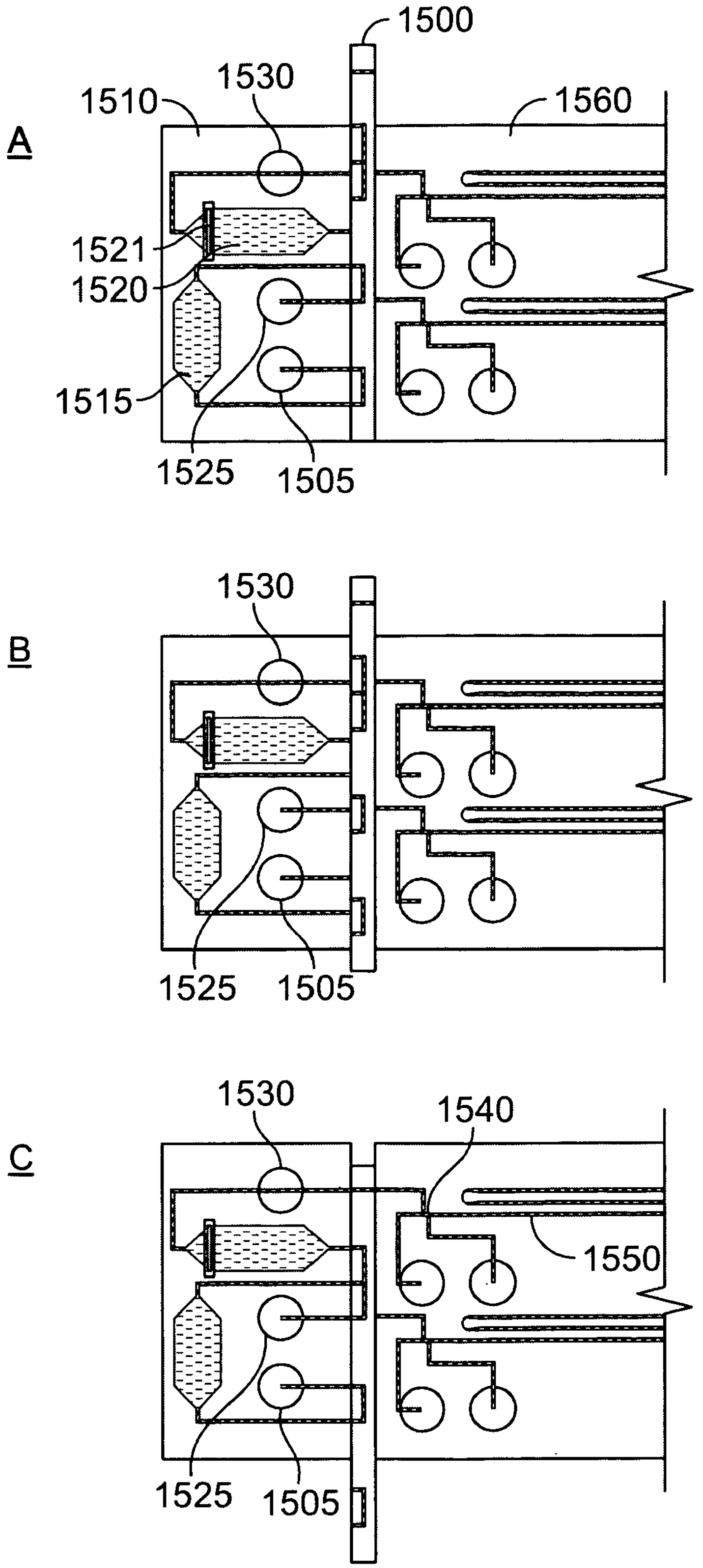
FIG. 16 shows three modular microfluidic microchips edge-joined in operable relationship, with three separate working positions created by movement of the central microchip relative to the two external microchips, according to the present invention.

FIGS. 16A-16C illustrate a further embodiment of a three-chip modular microfluidic system according to the present invention.

In this embodiment, microchip 1500 is operably positioned between microchip 1510 and microchip 1560.

Microchip 1500 has chip-interfacing edges that are longer than the chip-interfacing edges of the chips with which it respectively interfaces. Conversely, microchip is shorter in length than chip 1510 and 1560 along the edges perpendicular to its interfacing edges. By reducing this dimension, the fluidic path through chip 1510 is much reduced, permitting microchip 1500 to act as a fluidic valve and/or router without adding significantly to the fluidic pathlength.

Not apparent from the drawing, microchip 1500 is in this embodiment disposable, with microchips 1510 and 1560 being reusable.

In a first position, illustrated in FIG. 16A, fluid sample can be added to well 1505 on microchip 1510 and moved by methods further described below to reaction chamber 1515 on microchip 1510. Microchip 1500 itself can then be moved, translating microchip 1500 with respect to both of microchips 1510 and 1560, against which microchip 1500 is sealingly biased.

As shown in FIG. 16B, such movement seals chamber 1515 to facilitate a sealed reaction, such as a thermocycling or enzymatic reaction. After the reaction is complete, microchip 1500 can again be moved, with FIG. 16C showing a third operable position.

In this third position, sample can be moved from chamber 1515 to chamber 1520 for cleanup (as for example, cleanup of a PCR reaction using shrimp alkaline phosphatase and exonuclease I). Usefully, chamber 1520 contains weir 1521 which can trap beads or other separation matrix without fully preventing fluid flow. Following capture on the cleanup matrix, solutions to wash and elute can be added through well 1525 and pumped through chamber 1520 to well 1525. When the sample is eluted from chamber 1520, it can be moved into well 1530 for injection into "twin T" injector 1540 and separation on CE channels 1550.

In other edge-sliding embodiments, the integration and/or isolation of various functions in a microchip system are achieved using only two fluidic microchips. The system comprises two micro-fabricated chips, edge-joined, in fluid communication with each other. At least one of the chips is moveable, by sliding action, relative to the other of the two, in order to redirect or seal the fluid paths. As in the three-chip embodiments, one or both of the microchips can have a polished edge in order to improve the seal (such as low-pressure seal) at the mating surfaces.

Figure 4:
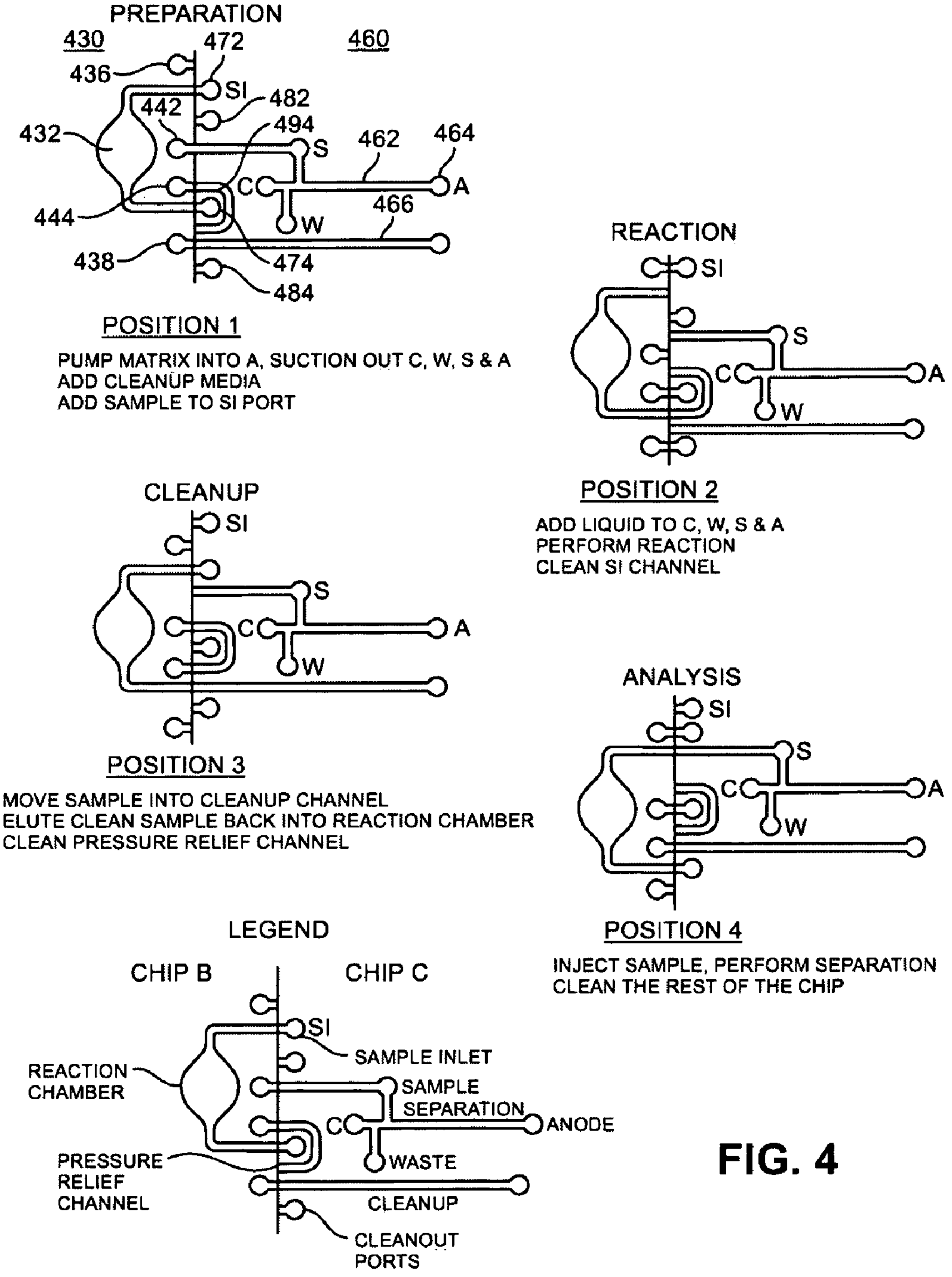
FIG. 4 shows the design and four working positions of a sliding linear valve system comprising two microchips, according to the present invention.

An example of a two-chip system is schematized in FIG. 4.

As exemplified, a first chip (chip B, 430, chip outline omitted) contains a reaction chamber 432 and four small cleanout ports 436, 438, 442, 444. A second chip (chip C) contains two sample inlet ports 472, 474, a standard separation channel with a twin-tee/cross injector 462, a sample cleanup channel 466, a pressure relief channel 494, and two small cleanout ports 482, 484.

In position 1, matrix is introduced into the anode port 464 of the second chip thereby filling the separation and injector regions. In typical use, this would be followed by suction cleaning of the wells. Sample and reactants are added to the sample inlet port 472 or 474 of the second chip thereby filling the reaction chamber 432 of the first chip. The sample cleanup channel 466 is either surface modified, pre-filled with monolithic capture matrix, or filled with media such as capture beads (wall bound or magnetic) at this step. The first chip is then moved to position 2 whereby the reaction chamber 432 is connected to the pressure relief channel 494 on one end and sealed on the other. The second end of the pressure relief channel 494 is also sealed. Chemical/biological reactions are performed in the reaction chamber. Next, the first chip is moved to position 3 where the reaction chamber 432 is connected to the cleanup channel 466. The contents of the reaction chamber 432 are moved into the cleanup channel 466 where undesired products pass on through and out of the system. The desired reaction products are then released from the capture media and moved back into the reaction chamber 432. Lastly, the first chip is moved to position 4 for sample injection and separation.

Figure 11:
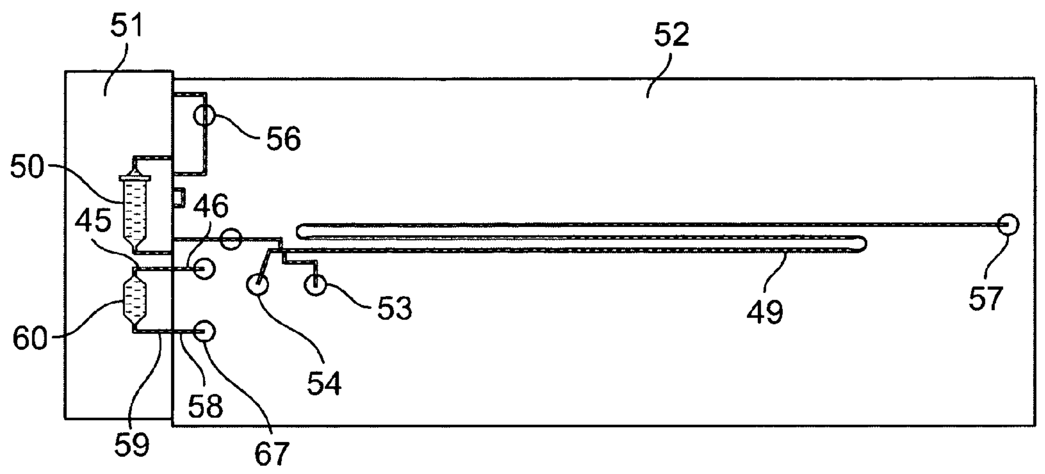
FIG. 11 is a design for two interacting modular microfluidic microchips, shown edge-joined in operable relationship, according to the present invention.

FIG. 11 shows another exemplary two-chip system, further suggesting, in outline, an exemplary shape for the chips themselves. As shown, the interfacing edges of rectangular microchips 51 and 52 are of substantially identical length, with the edges perpendicular thereto differing in length. The substantial identity in length at the interfacing edge is not required; nor must each of the plurality of chips be rectangular.

However, certain advantages in modularity are realized by integrating chips having at least one substantially identical (shared) dimension. And as discussed above with respect to the three chip embodiment of FIG. 16, certain advantages may be achieved by reducing the size of one or more chips in at least dimension, such as reduction in fluidic path lengths.

In the embodiment shown, microchip 51 has both a sample preparation chamber 60, which in various embodiments is designed for PCR, or for cycle sequencing, or for other desired reactions, and chamber 50, designed for sample cleanup or another process stage. Microchip 52 contains all of the reservoirs and features required for DNA fragment analysis, including: anode (alternatively, anode well) 57, cathode (alternatively, cathode well) 54, CE channel 49, and waste port 53.

Exemplary use of this illustrative two-chip modular microfluidic system is further shown in FIGS. 13A-13C, with relative linear movement of chips 51 and 52 permitting different stages of a multistep analytical process to be performed.

In FIG. 13A, the chips are positioned so that channel 59 is sealably disconnected from channel 58, and channels 45 and 46 are sealably disconnected from one another. This position closes a linear valve created by the interface between the chips, sealably isolating reaction chamber 60, for example to permit thermal cycling.

Conversely, in this position channels 47 and 58 are brought into fluid communication with each other, as are channels 63 and 64; this fluidly connects well 67 with well 68. This connection allows material to flow from well 67 to well 68, or vice versa, allowing chamber 50 to be filled and washed. In various embodiments, such step involves movement of beads or nanoparticles into chamber 50 for sample cleanup, sample processing (such as cycle sequencing, PCR reactions, or other thermal cycling reactions), or other processing.

Returning to FIG. 13A, isolation of chamber 60 permits thermocycling to be performed while chamber 50 is filled with sample cleanup materials such as glass beads, gels, such as sieving gels, nanoparticles, monoliths, or other separation material.

Many devices well known to one schooled in the art can be used to effect thermal cycling in chamber 60. As further discussed below, such temperature control devices are conveniently moved off the microchips onto apparatus designed to modularly engage and fluidically integrate the microchips of the present invention. Among the thermocycling devices that can conveniently be included in such apparatus are external nichrome heater, air-based thermal cycling, Peltiers, circulating water, other thermal cycling methods.

After thermal cycling, microchip 51 is slideably repositioned with respect to microchip 52 into the position shown in FIG. 13B. In this position, chamber 60 is placed into fluid communication with chamber 50.

In one embodiment, cycle sequencing products, or PCR amplified sample, is moved from chamber 60 onto beads loaded into chamber 50 for cleanup of the reaction; fluid movement can be motivated by applying pressure, as by pump, such as syringe pump, to well 67'. The cleanup may usefully remove salts, fluors, reaction products, and/or perform a separation of the sample. For cycle sequencing, SPRI beads from Agencourt prove particularly useful.

Thereafter, microchip 51 is slideably repositioned with respect to microchip 52 to the position shown in FIG. 13C.

In this third position, chamber 50 is positioned in fluid communication with well 68. Pressure can be applied to well 67 to pump material from chamber 50 into well 68 which, in this example, is upstream of a "Twin T" injector 55.

The cleaned up sample from cycle sequencing, PCR, or other reaction can moved into well 68, and then loaded by pressure or electric force into the twin T injector 55. The sample can then be injected by means well known to one skilled in the art. After injection, well 68 and the waste well can be back biased, and the samples separated from cathode well 54 through the folded CE channel 49 to anode well 57.

In such a modular, slideably reconfigurable two-chip system, PCR can be performed in a chamber and size patterns analyzed by CE for confirmation. The PCR can be a real time PCR reaction with analysis of the reactions in chamber 60 or end-point analyses for genetic analysis such as genotyping, identification, or forensics.

Alternatively, such a modular, linearly reconfigurable two-chip system may be used for cycle sequencing. The cycle sequencing products are made in chamber 60, and unincorporated dyes and other materials removed in chamber 50 before CE analysis in separation channel 49.

Figure 13:
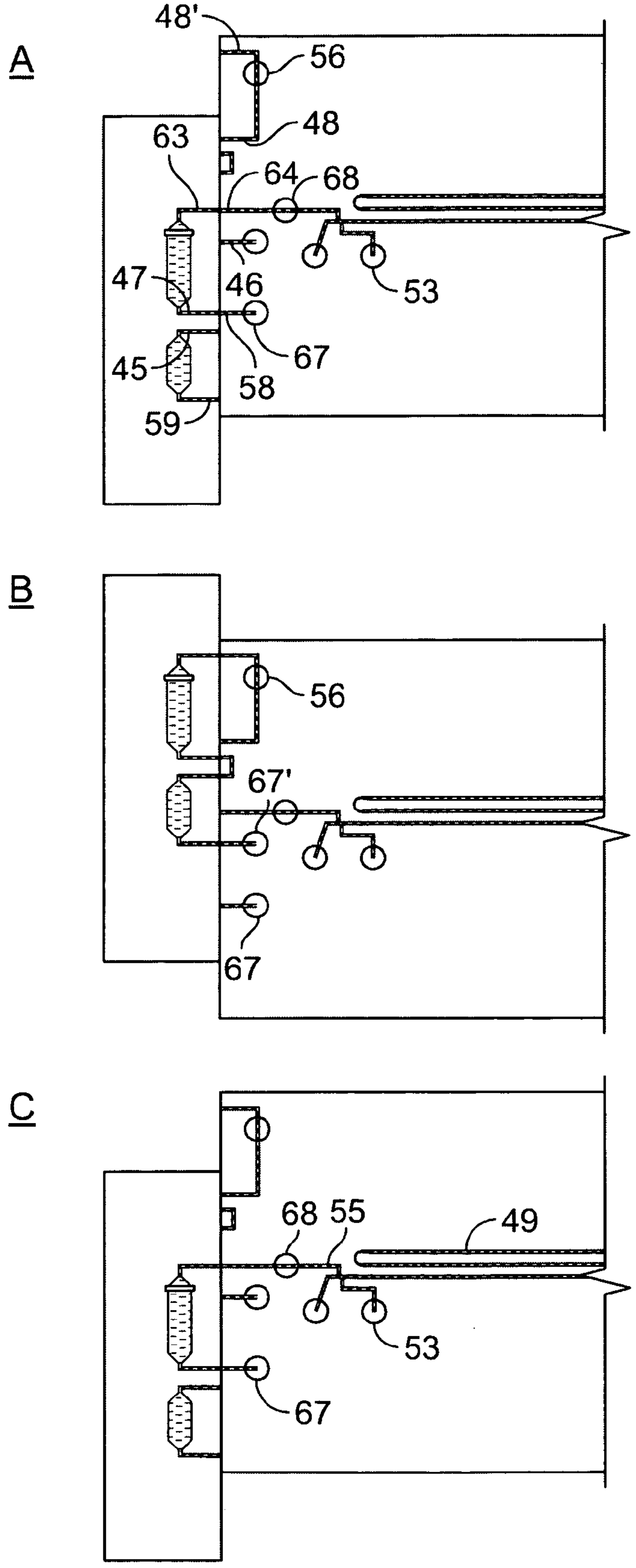
FIG. 13 shows the design and three working positions of two slideably edge-joined modular fluidic microchips according to the present invention.

As is known to those skilled in the art, other processes can also be adapted to the two reactor system such as that shown in FIGS. 11 and 13. For example, protein digestions can be performed in chamber 60, and labeling performed in chamber 50. Separation chamber 50 can also usefully lead to a multi-dimensional analysis, such as by mass spectroscopy.

In other embodiments, the chip moving means are capable of moving at least a first chip in a direction perpendicular to (normal to) the axis of the interface. Perpendicular movement may be in addition to, or an alternative to, movement along the axis of the interface. Accordingly, the chip moving means can, and typically will be, capable of effecting both coaxial and normal movement of at least one microchip of the system.

In one series of embodiments, movement is perpendicular to the interface between a first and second microchip, but within a plane defined by the bottom (and/or top) surfaces of the chips, herein termed "2D movement".

Certain of these embodiments provide a 2D jogging movement.

In these embodiments, fluidic connections are made and broken between different chips in a controlled way. In the sliding linear valve design above-described, fluidic communication can be made or isolated between different channels on each chip by sliding one chip against the other. During the sliding process, the chips keep in contact with each other across the interface to maintain a low-pressure seal and therefore prevent leakage at the mating surfaces. Hydrophobically coating the mating surfaces of both chips is usually helpful when the chips are made of glass.

2D jogging embodiments take advantage of surface tension to create virtual valves at the edges of the chips. To isolate fluidic communication between the edge-joined chips, the two chips are pulled apart from each other. Surface tension keeps the liquid (e.g., water) within each respective channel without leaking. The chips can be moved to the next desired position, with fluidic connection re-established between the chips as soon as their edges contact.

There are two major differences between the 2D jogging approach as compared to sliding. In 2D jogging, chips need not maintain contact with each other. This provides additional integration flexibility. The physical durability of the surface coating is also less of a concern in the jogging approach since no wearing occurs while the chips are moved.

Figure 5:
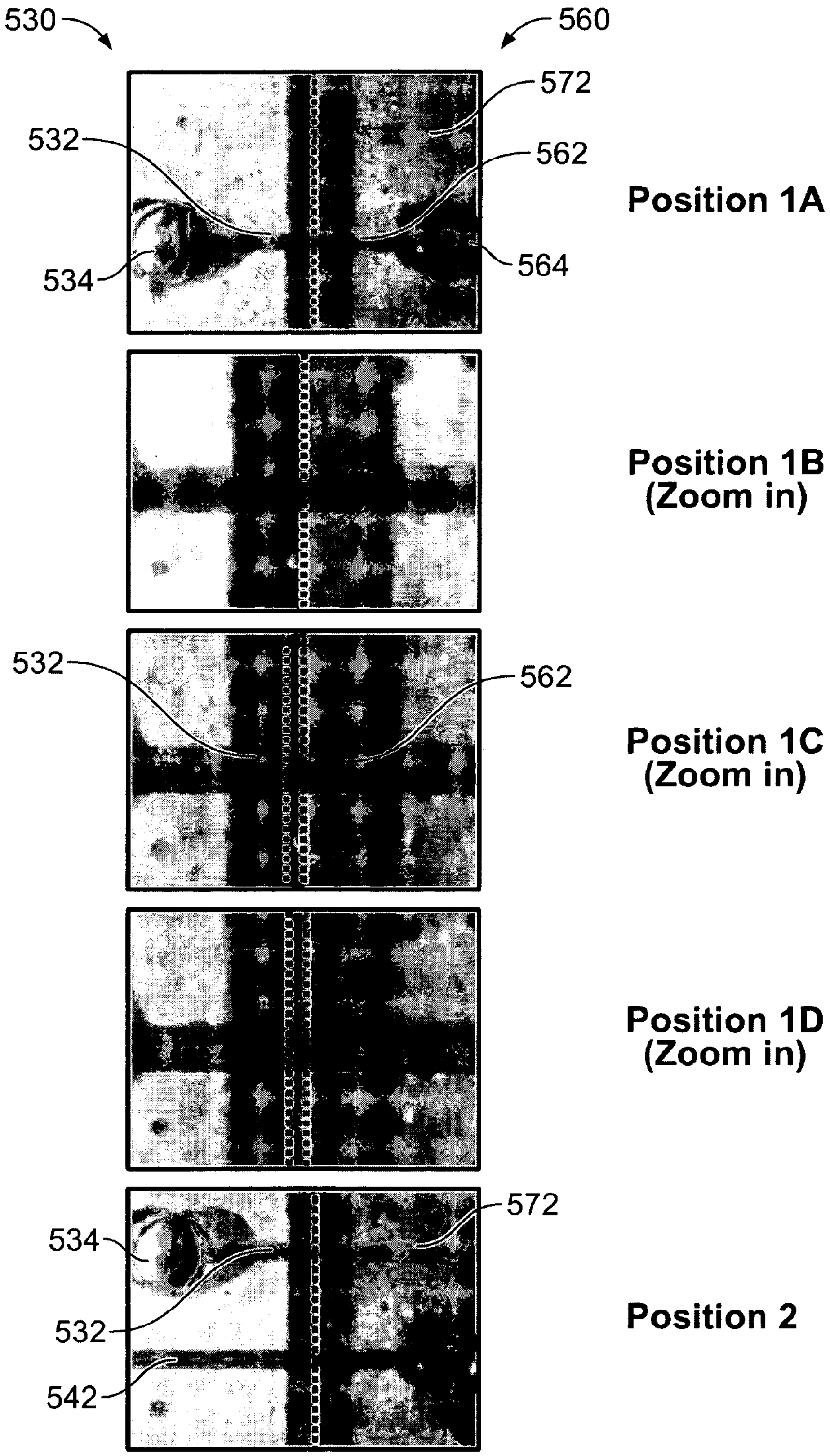
FIG. 5 shows, in a series of photographs, a step-by-step example of a two dimensional jogging process for liquid transfer between microchips, according to the present invention.

The 2D jogging approach for reactant transfer is exemplified in FIG. 5.

Two fluidic chips 530 and 560 are made and edge polished. A thin layer of Cr/Au film is deposited onto the polished mating surfaces. These chips are then immersed in an ethanolic solution of octadecanethiol to form a hydrophobic monolayer coating (contact angles of greater than 90° for water were observed). The 2D jogging concept is demonstrated by transferring an aqueous dye solution between channels on different chips.

FIG. 5 shows portions of the two chips in five panels; the scales for each of the five panels are not exactly the same. The dotted lines superimposed on the photographs highlight the edges of the chips: a single dotted line at the interface between the two chips shows that the two chips are in physical edge contact to each other.

On a first chip 530, a first channel 532 with a width of 270 μm is connected to a sample loading port 534. A second channel 542 is also shown on the same chip 530. On the second chip 560, a first channel 562 is connected to a sample loading port 564. A second channel 572 is also shown on the same chip 560.

In position 1A, the first and second chips are in physical contact with each other, while the first channel 532 of chip 530 is aligned with the first channel 562 of chip 560. All channels on both chips are empty. In position 1B, dye is loaded in the sample loading port 564 of the first channel 562 on the second chip 560, and then transferred to the first channel 532 on the first chip 530.

The two chips are then slowly pulled apart, as shown in position 1C. Fluid connection is maintained across the short gap. As the chips are pulled further apart (position 1D of FIG. 5), fluid connection breaks, and the liquid is pulled back into each respective channel by surface tension.

Then the relative position of the two chips is moved such that the first channel 532 on the first chip 530 is aligned and in physical contact with the second channel 572 on the second chip 560. The dye is then transferred into the second channel 572 on the second chip 560.

Tests on the 2D jogging approach are also successfully performed with distilled (Di) water. Different coating chemistries (e.g., fluorinated monolayer, vapor deposited Teflon) can be applied to deal with organic solutions and to prevent surface adsorption of such solutions.

In another series of embodiments, movement is perpendicular both to the interface between a first and second microchip, and to the plane defined by the bottom (and/or top) surfaces of the chips (Z-axis movement). Such movement accommodates sealable stacking of microchips (face-to-face reversibly sealable engagement).

In other embodiments, the chip moving means are capable of rotating at least a first chip with respect to a second.

Typically, such rotary movement is used when chips are stacked in a face-to-face reversibly sealable engagement, with rotation effecting changes in the microfluidic circuitry. Alternatively, rotary valves may be stacked atop one or a plurality of microchips, as further described below.

In another aspect, the integration and/or isolation of the various functions in a microchip system is achieved using low volume valves that are designed to be compatible with microfluidic devices, such as fluidic microchips. Such valves can usefully seal fluidic sections, such as sections or chambers within a fluidic microchip, during thermal cycling, for example during cycle sequencing or amplification. Such valves can also facilitate fluid routing and control in integrated microchips.

FIGS. 6A-6D show a variety of miniature valve designs for use with microfabricated devices, such as fluidic microchips. These valves consist of two major elements: a microfabricated device, such as a fluidic microchip, and a small laser-machined or conventionally-machined movable part. The microfabricated device and the movable part are biased against each other, as by resilient biasing means, such as springs.

The microfabricated device may be made of glass or plastic or ceramic; the machined part is preferably, but not invariably, composed of plastic.

In the first three designs (FIGS. 6A-6C), the valves are in top contact with holes, or ports, of the microfabricated device. In the last design (FIG. 6D), the channels terminating at the edge of the device serve as access holes, or ports, and the valves are in end contact with the channels. In each of the designs, the movable valve component contains a small machined groove (similar or slightly larger in cross section to the microfabricated channels) that is used to connect two or more access holes in the microchip, much like the rotor in an LC valve.

In the rotary designs (FIGS. 6A and 6B), the groove may connect a common hole to any of a number of radial holes or may be configured to connect adjacent holes. With the sliding design (FIGS. 6C and 6D), one or more adjacent holes may be connected. In either configuration, one or more holes may be closed off. In practice, the moving valve(s) component may be configured as part of the instrument or as part of microchip assembly although the actuator will likely be part of the instrument. This valve approach can handle tens of bars of pressure. We have observed 10 bar sealing.

Figure 6A:
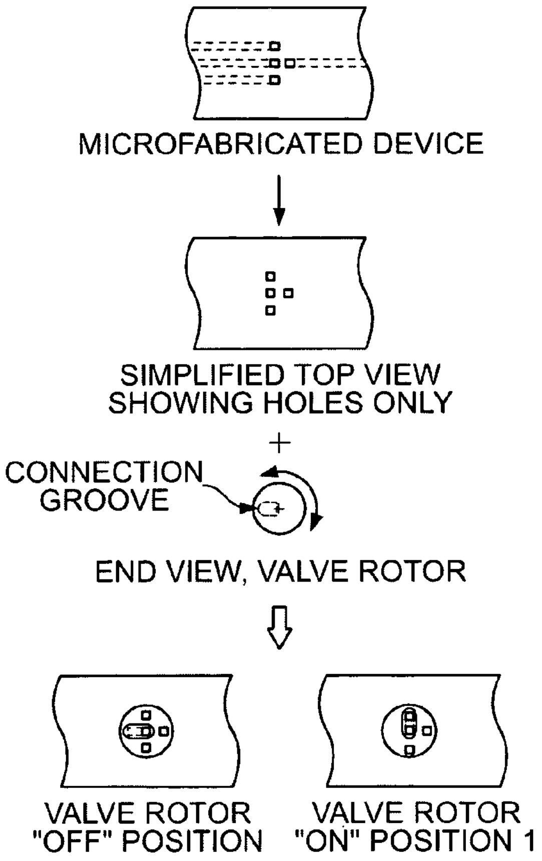
FIGS. 6A-6D show various designs of miniature valves for integration of modular microfluidic microchips, according to the present invention.
Figure 6B:
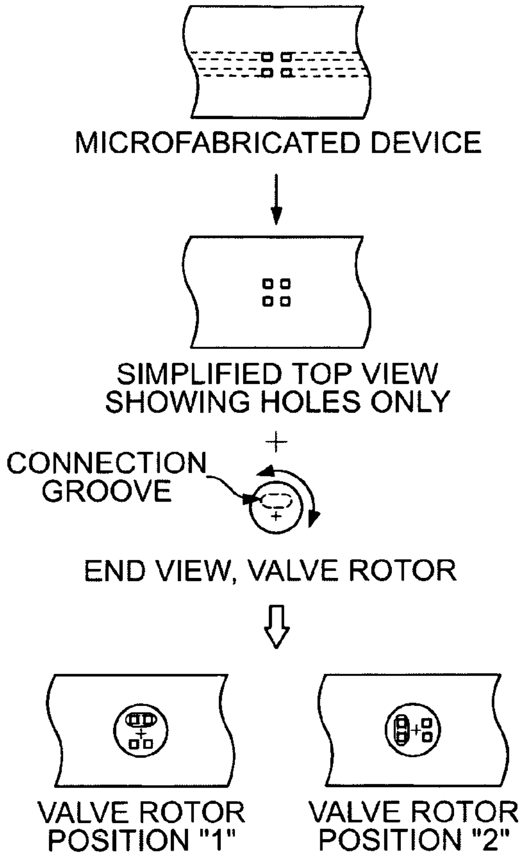
Figure 6C:
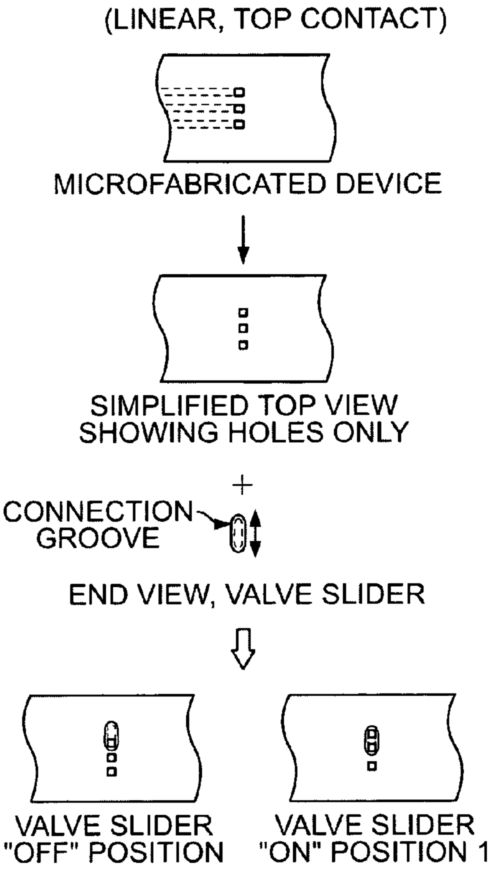
Figure 6D:
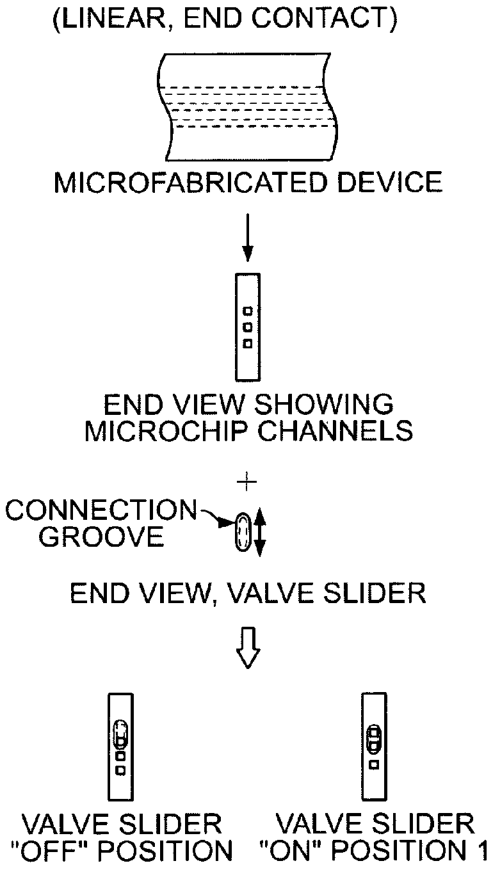
Figure 7A:
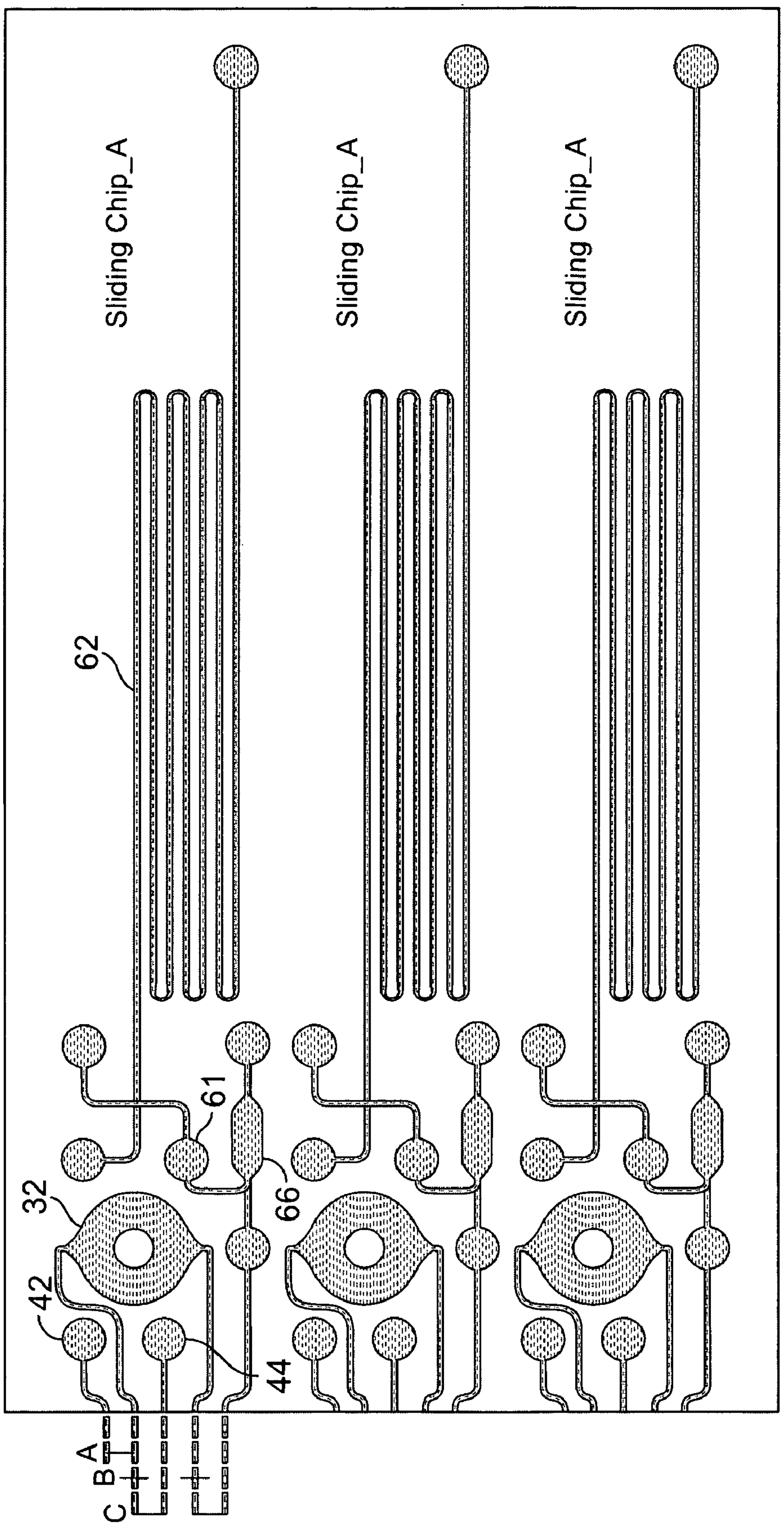
FIGS. 7A and 7B show integrated microchip designs using the edge contact, sliding linear valve approach, according to the present invention.
Figure 7B:
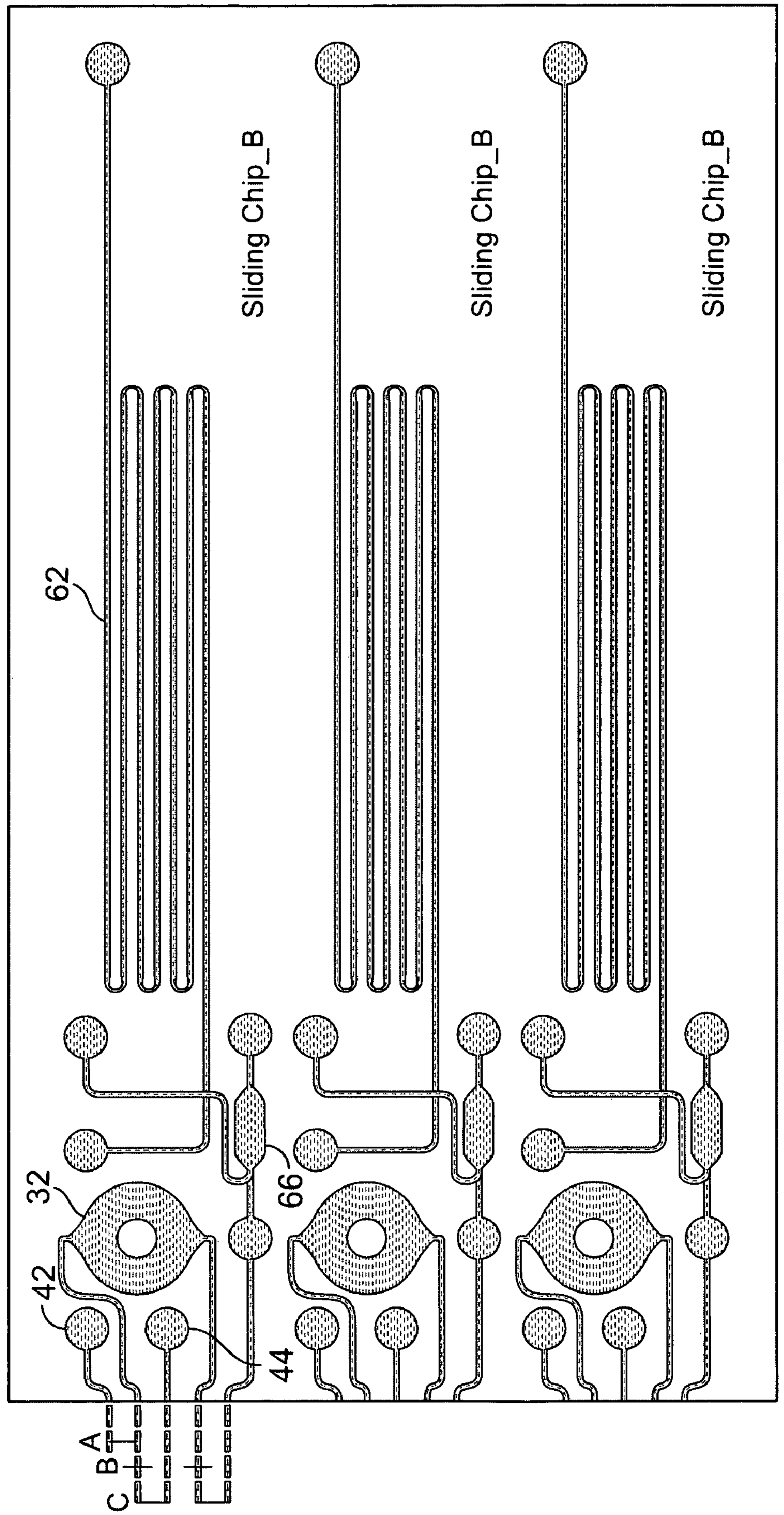

FIGS. 7A and 7B schematize exemplary microfabricated glass devices (glass fluidic "microchips") used in connection with the edge contact sliding valve as shown in FIG. 6D. Three sets of miniature systems are shown, although additional systems can be added to a microchip device. Each system contains a reaction chamber 32, a sample cleanup chamber 66, a separation channel with a twin-tee/cross injector 62, as well as two filling/cleanout ports 42 and 44. All the channels terminate at the edge of the microchip, as in the sliding linear valve designs shown in FIGS. 1-4, and serve as access holes. The sliding valves are in edge contact with the channels. The microchip and the movable part are spring biased against each other. The movable part (sliding valve) is made of plastic and contains connection grooves as shown in FIG. 6D. One or more adjacent holes may be connected (position A or C of both FIGS. 7A and 7B). And one or more holes may be closed off (position B of both FIGS. 7A and 7B). Cleaned sample is injected from the cleanup chamber directly to the separation channel in the design shown in FIG. 7B, while it is first transferred to the sample loading port 61 of the separation part, then injected in the design in FIG. 7A.

DNA amplification, sample cleanup and separation were successfully carried out using these devices.

Figure 10A:
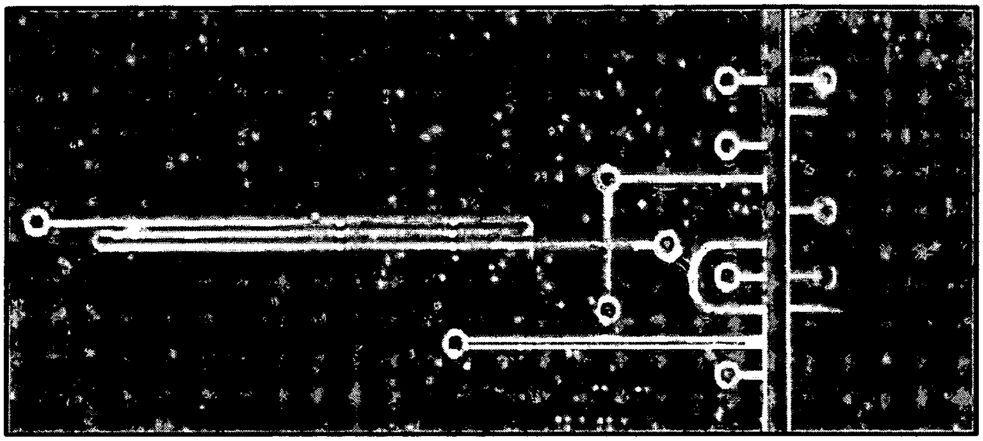
FIG. 10 is a photograph of a pair of modular microfluidic microchips collectively comprising a reaction chamber, sample cleanup channel, and capillary electrophoresis (CE) channel, the chips shown in adjacent but undocked relationship, according to the present invention.
Figure 10B:
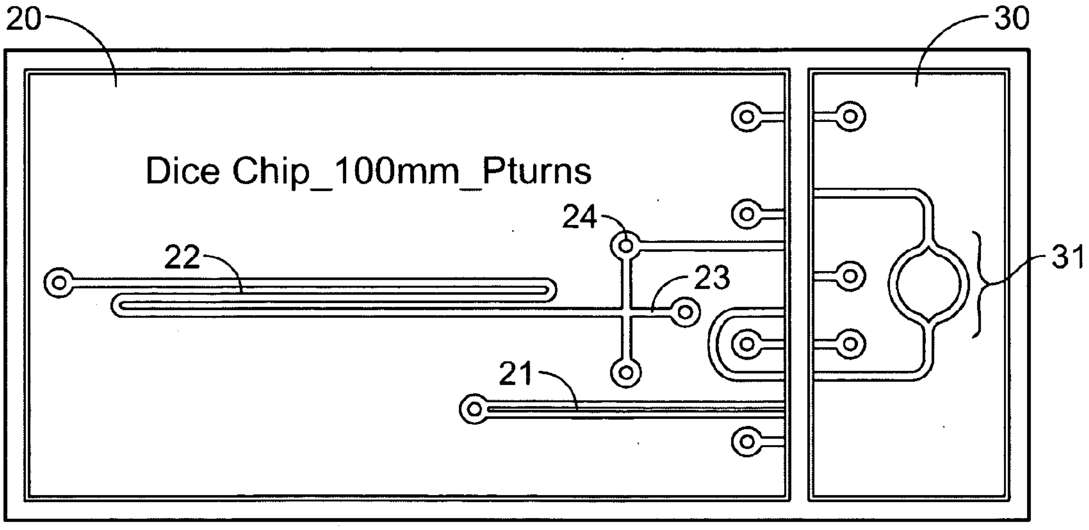

FIG. 10 is a photograph of a pair of functional glass modular microfluidic microchips, microchip 20 and microchip 30, according to the present invention. Microchip 30 has sample preparation chamber 31 for PCR, cycle sequencing or other reactions. Microchip 20 has a channel 21 for sample cleanup or other processing and a folded capillary electrophoresis (CE) analysis separation channel 22. The CE channel 22 is connected to a "twin T" injector 23. The injector is, in turn, connected to well 24 which can be connected to reaction chamber 31 or to separation channel 21. This design is suitable for integrating 1) PCR sample preparation and cleanup and 2) cleanup with separation.

The slowest process in a series of preparative and/or analytic processes will typically limit the throughput through a monolithic microfluidic system—that is, through a system in which the serial processes are integrated into a unitary fluidic microchip. In contrast, the modularity of the integrated systems of the present invention permits such rate-limiting process or analytical steps to be reversibly removed from, and then reintegrated into, the process stream, permitting greater throughput.

Thus, in another aspect, the invention provides an integrated fluidic microchip system capable of reversibly removing microchips—and their associated analytical and/or process functions—from the process stream, by reversibly undocking microchips as desired. The ability to undock microchips and, later, to reintegrate the microchips into the process stream reduces or eliminates temporal mismatch as among processes by deconstructing a serial process into a process comprising serial and at least one parallel step.

As in the systems above-described, the system comprises a plurality of fluidic microchips, each containing at least one capillary channel. Each of the plurality of microchips is biased towards, and reversibly sealed to, at least one other of the microchips, creating an interface therebetween; at pressures to be used in the system, the seal between and among microchips is fluid-tight.

Also as above, the system further comprises means for linearly moving at least a first of the plurality of microchips with respect to at least a second microchip to which it is reversibly sealed; the movement is such that at least one of the capillary channels in the first and/or second microchip can be connected or disconnected across the interface by the relative movement of the first and second microchip.

In addition, however, the systems of this aspect of the invention further comprise means for reversibly segregating one or more of the microchips in fluidic discontinuity from all others of the plurality of microchips.

FIGS. 9A-9D schematize the undocking of a microchip after an analytical or preparative process that is itself effected (or facilitated) by the relative linear movement of two microchips in an exemplary two-chip, edge-joined, embodiment of the system of the present invention.

Figure 9:
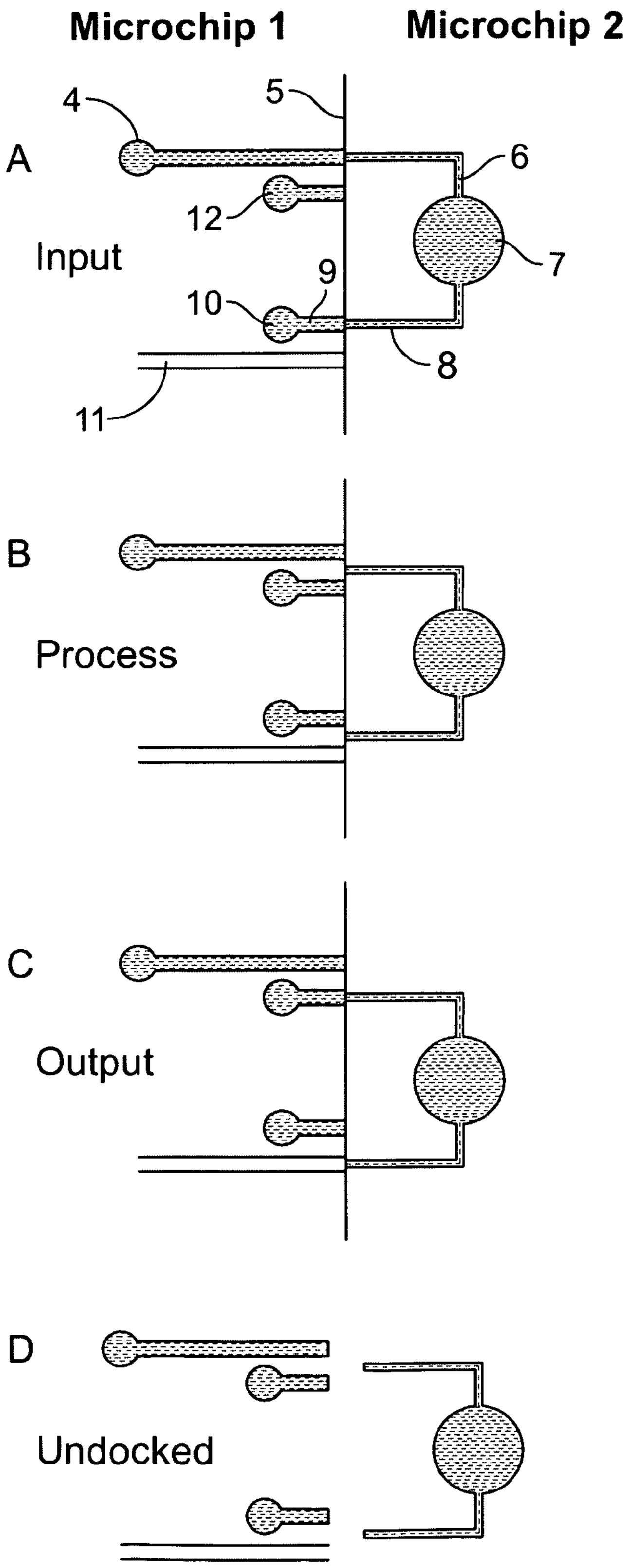
FIG. 9 is a schematic showing three working positions for two slideably edge-joined modular microchips, followed by a position in which the two chips are in an undocked, relationship, according to the present invention.

In FIG. 9A, labeled INPUT, channel 3 connects a well 4 on microchip 1 across interface 5 at the edges of the two microchips to a channel 6 that connects to a reaction chamber 7 on microchip 2. Reaction chamber 7 connects to channel 8 that, in turn, connects to channel 9 on microchip 1 across the interface 5. Channel 9 connects to well 10 on microchip 1.

When the two microchips are positioned as shown in FIG. 9A (INPUT), the connections between the channels 3, 6, 8, 9 are sufficient to allow fluid flow, electrical connection, or other circuits to be completed from well 4 through reaction chamber 7 to well 10. In other embodiments, the wells can be replaced with reservoirs or other structures and functions comprised of valves, pumps, routers, reaction chambers, detectors, etc. FIG. 9A shows a configuration to input a sample from microchip 1 to microchip 2 using vacuum, pressure, or electric potential forces to drive the liquid. The same positioning can also move a sample from reaction chamber 7 through channels 8 and 9 to well 10.

In FIG. 9B, labeled PROCESS, microchip 2 has been linearly translated coaxially along interface 5 with respect to microchip 1.

Channels 3 and 9 on microchip 1 now terminate on the face of the microchip 2; channels 6 and 8 on microchip 2 now terminate on the face of microchip 1. In effect, valves have been formed at the ends of all the channels at the interface of the microchips; as discussed in detail herein above, an advantage of sealing the ends of the channels is that sealing prevents loss of reaction volume during heating, cycling, or other manipulations.

In addition, reaction chamber 7 on microchip 2 is sealed, permitting reactions such as cycle sequencing, PCR, transcription, reverse transcription, enzymatic assays, or other biochemical or chemical reactions to be performed.

To output the processed sample, microchip 1 and microchip 2 are repositioned with respect to one another—either by linear movement of microchip 1, linear movement of microchip 2, or reciprocal movement of the both chips—as shown in FIG. 9C (labeled OUTPUT). In the exemplified edge-joined two-chip embodiment, the relative motion is coaxial with the chip interface.

Pressure, electrical or other means of motivating fluid movement is applied at well 12 to move the sample from reaction chamber 7 to channel 11 at the bottom of microchip 1; this effectively routes the sample to a new channel or well. In some embodiments, for example, channel 11 can lead to a "twin T" injector and a capillary electrophoresis (CE) separation channel, in others to a sample cleanup device, in others to a mass spectrometer, such as a mass spectrometer with an electrospray sample input interface, or to a diagnostic device.

FIG. 9D, labeled UNDOCKED, shows the two microchips undocked; one or both may now be segregated in fluidic discontinuity from all others of the plurality of microchips in the system. In the undocked configuration, one or both microchips can be separately handled and processed.

In some embodiments, the channel exiting at the earlier interfaced edge is sealed to prevent evaporative loss and/or contamination, and fluid present within the sealed microchip further incubated or stored. In some embodiments, a plurality of microchips can be processed in parallel, e.g. held in an incubator while a reaction occurs.

In another aspect, the invention provides modular fluidic microchips useful in the systems and methods of the present invention.

The microchips used in the systems, apparatus, and methods of the present invention, such as those described above, can be manufactured from glass, plastic, ceramic, and other materials, using methods well known in the microfluidic art. See, e.g., Li, *Electrokinetics in Microfluidics*, Academic Press (2004) (ISBN: 0120884445); Woias et al., *Microfluidics, Biomems, and Medical Microsystems II* (Proceedings of SPIE), SPIE-International Society for Optical Engine (2004) (ISBN: 081945253X); Tay, *Microfluidics and Biomems Applications* (*Microsystems*, 10), Kluwer Academic Publishers (2002) (ISBN: 1402072376); Nguyen et al, *Fundamentals and Applications of Microfluidics*, Artech House Publishers (2002) (ISBN: 1580533434); Koch et al.,

*Microfluidic Technology and Applications* (Microtechnologies and Microsystems Series), Taylor & Francis Group (2000) (ISBN: 0863802443); the disclosures of which are incorporated herein by reference in their entireties.

Glass microchips can, for example, be fabricated using a process with either an Au/Cr mask or an amorphous silicon mask deposited by chemical vapor deposition (CVD), application of a hexamethyldisilizane (HMDS) adhesion layer, and a hydrofluoric acid (HF) etch.

In these embodiments, BOROFLOAT® glass wafers (Schott, Yonkers, N.Y.) are pre-etched in concentrated HF, then an aSi mask deposited by CVD and an adhesion layer of HMDS coated on the top of the aSi. The wafer is spin-coated with a thin layer of photoresist (Shipley, Santa Clara, Calif.) and soft-baked. The photoresist is patterned with UV light through a mask having the desired channel pattern. The photoresist is developed and the exposed amorphous silicon removed. The channel pattern is chemically etched into the glass with concentrated hydrofluoric acid. The residual photoresist and amorphous silicon are stripped off and access holes are drilled using a CNC-minimill with diamond drills. After a final cleaning in $H_2SO4/H_2O_2$, the substrate is thermally bonded with a blank wafer to produce a capillary array electrophoresis (CAE) chip.

For prototypes, holes can be drilled with a mini-mill and then a top plate thermally bonded. Ultrasonic drilling can be used for production. Weirs and dams can be formed, e.g. for retaining flowable media, such as beads, by using a two mask process with two different etch depths.

In some embodiments, the edges and the contact surfaces of glass microchips are further improved.

In the above-described embodiments of the systems of the present invention, the pressure sealing requirements at the chip-to-chip interfaces can be low, on the order of 5-10 psi for viscous fluids, such as linear polyacrylamide (LPA) matrix (in the above-described embodiments, pumped in from the anode port) and even lower for low viscosity fluids such as aqueous samples. Thus, in some embodiments, the pressure sealing requirements can be no more than 30 psi, 25 psi, 20 psi, 15 psi, even no more than about 14 psi, 13 psi, 12 psi, 11 psi, 10 psi or lower. In some embodiments, the sealing pressure can be as low as 9 psi, 8 psi, 7 psi, 6 psi, 5 psi, 4 psi 3 psi, 2 psi, even as low as 1 psi or lower.

Nonetheless, increased sealing pressures can be useful, and sets of edge features and materials can assist in the sealing engagement of microchips.

For large surfaces, the contact can, for example, be via an outwardly convex radial finish: the reduced contact area increase the pressure on the contacting edge or face. The contact area can also be reduced by creating protrusions, or "mesa"-like structures, as shown in FIG. 22.

Figure 22:
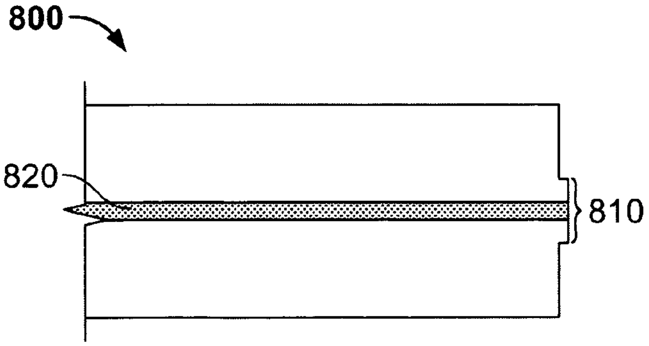
FIG. 22 is a partial side sectional view of an exemplary fluidic microchip having an edge etched to create a mesa at the point intended to contact an adjacent microchip, thus increasing sealing pressures, according to the present invention.

FIG. 22 is a partial side cross-sectional view of one embodiment of an exemplary microchip of the present invention. Chip 800 has channel 820 exiting the edge of microchip 800 through protrusion 810, formed in the shape of a mesa. Such a shape can be made by mini-mill machining and hand lapping, by molding, or other automated methods known in the art. The mesa-like protrusion, 810, can be further polished to further enhance the contact.

Edge finishes on glass microchips can be hand polished, e.g., with 0.5 mm lapping paper or polished on lapping machines.

Plastic microchips useful in the systems, apparatus, and methods of the present invention can be fabricated using art-known approaches; plastic is particularly useful in the fabrication of disposable microchips.

Two methods are widely used for plastic microfluidic chips fabrication: injection molding and hot embossing. In the injection technique, plastic is liquefied and injected into the heated mold. This is fast (a few seconds per part) and is suitable for high volume production, but the mold is expensive. In hot embossing, a plastic sheet is heated close to glassy temperature (Tg) and the mold (pre-form) is pressed to the plastic sheet. This process is more suitable for prototyping or low volume production and is cheaper. Both techniques require mold microfabrication, cover plate bonding, and subsequent drilling of holes. Edges on plastic microchips may be formed to eliminate polishing completely.

For example, certain embodiments of plastic fluidic microchips of the present invention can be prepared by hot embossing, substantially as follows.

The first step is fabrication of a pre-form. Microchannels are etched into a silicon wafer in a deep reactive ion etching machine. Silicon dioxide or nitride is the usual mask for this etching. High aspect ratios, such as 5:1, can be obtained. The negative pre-form is later obtained by nickel electroplating of structures and etching of silicon. A mini-mill can also prototype less detailed structures in metal for use as a master.

The second step is hot embossing. A plastic sheet is heated to temperature close to the glass transition temperature (Tg) and the pre-form is pressed to the plastic sheet. The plastic has to be hot enough to conform to the preformed structure. The plastic is cooled and the pre-form de-molded. A proper demolding temperature is important to obtain a good quality embossed product; for this reason, the best results are typically obtained using automated machines.

In the third step of this exemplary fabrication process, microfluidic ports are drilled, either in the embossed part prepared as above, or in a blank part (as described below). Drilling in the embossed part is typically preferred because no alignment is needed.

Next, the embossed part is bonded to a blank part.

The two plastic parts are cleaned and placed into contact. As is well known, cleaning is important to establishment of a good bond. Heat and pressure are used for bonding. Parts are heated close to the Tg in a hydraulic press. If high pressure is not needed, micro-channels can be covered with a thin foil by a laminating process or just with adhesive tape.

Typical plastics used for microfluidic devices, and useful in the fluidic microchips of the present invention, are polymethylmethacrylate (PMMA) and polycarbonate for chips maintained at temperatures under 90° C., and Zeonoorä and polyolefin for chips to be subject to higher temperatures, such as those used in thermal cycling.

Many plastics contain unsaturated sites that may be oxidized, e.g., with permanganate, to introduce functionalities such as aldehyde or carboxyl for the covalent attachment of polymers. Amine terminal polymers can then be covalently attached through reductive amination or electrophilic addition by use of water soluble carbodiimides. Saturated plastics can be oxidized by the use of peroxides or treatment in cold plasma.

Coatings can improve performance and add functionalities to microchips, including the attachment of molecules through well known linkages, such as biotin-streptavidin. The attachments can be used to remove molecules specifically, such as by using antibodies attached to coatings. The antibodies capture molecules from fluids for detection for applications such as molecular diagnostics or biodefense.

For plastic modular microfluidic microchips, the edges can have features molded, embossed or otherwise microfabricated during production.

In certain embodiments, the systems of the present invention include, among the plurality of microchips, microchips manufactured from like materials, such as plastic or glass.

For glass-to-glass docking, good seals are obtained when a hydrophobic self-assembled monolayer of 1-octadecanethiol is deposited onto a gold coating on the mating edge or face: the contact angle of deionized water on the gold-coated mating surface can be greater than 90° after such monolayer coating.

In other embodiments, systems of the present invention can include, among the plurality of microchips, microchips manufactured from different materials.

In certain of these latter embodiments, the system can usefully include plastic microchips and glass microchips. Interfacing glass microchips with plastic microchips presents several advantages.

For example, the hard glass can form a reusable chip, with plastic used for chips intended for single use and subsequent disposal. Indeed, a significant advantage of the modular microfluidic systems and methods of the present invention is that certain process steps can be assigned to reusable components and others of the process steps assigned to disposable modules. In some embodiments, for example, a reusable glass preparatory chip is coupled to a disposable plastic assay-specific chip. In some embodiments, thermal reactions are performed in a glass chip mated to a plastic chip; the plastic remains relatively isolated due to the low thermal conductivity property of plastic.

Another advantage of mating glass to plastic microchips is that the edges of the glass chip can readily be polished with an outwardly convex radius; when a plastic is biased against the glass microchip, the plastic can deform slightly to create a tight microfluidic seal. Joining glass microchips to plastic microchips also affords certain surface tension advantages, reducing capillary forces at the microchip interface.

In various of the microchips and valves above described, such as the miniature valve designs shown in FIGS. 6*a*-6C, very small access holes are desired. While it is possible to drill small holes in plastic, it is very difficult to fabricate very small, high aspect ratio holes (e.g., 100 μm across×1 mm deep) in BOROFLOAT® or other glasses. Conventional diamond drilling and ultrasonic methods are limited to larger diameters and deeper holes become more difficult as dimensions shrink. Although quartz can be laser drilled, BOROFLOAT® and other glasses do not survive the process.

In another aspect, therefore, the present invention provides a method for fabricating glass chips incorporating very small holes with very high aspect ratios, although not arbitrarily positioned. The method is especially suitable to small holes that are arranged in a linear fashion.

Figure 8:
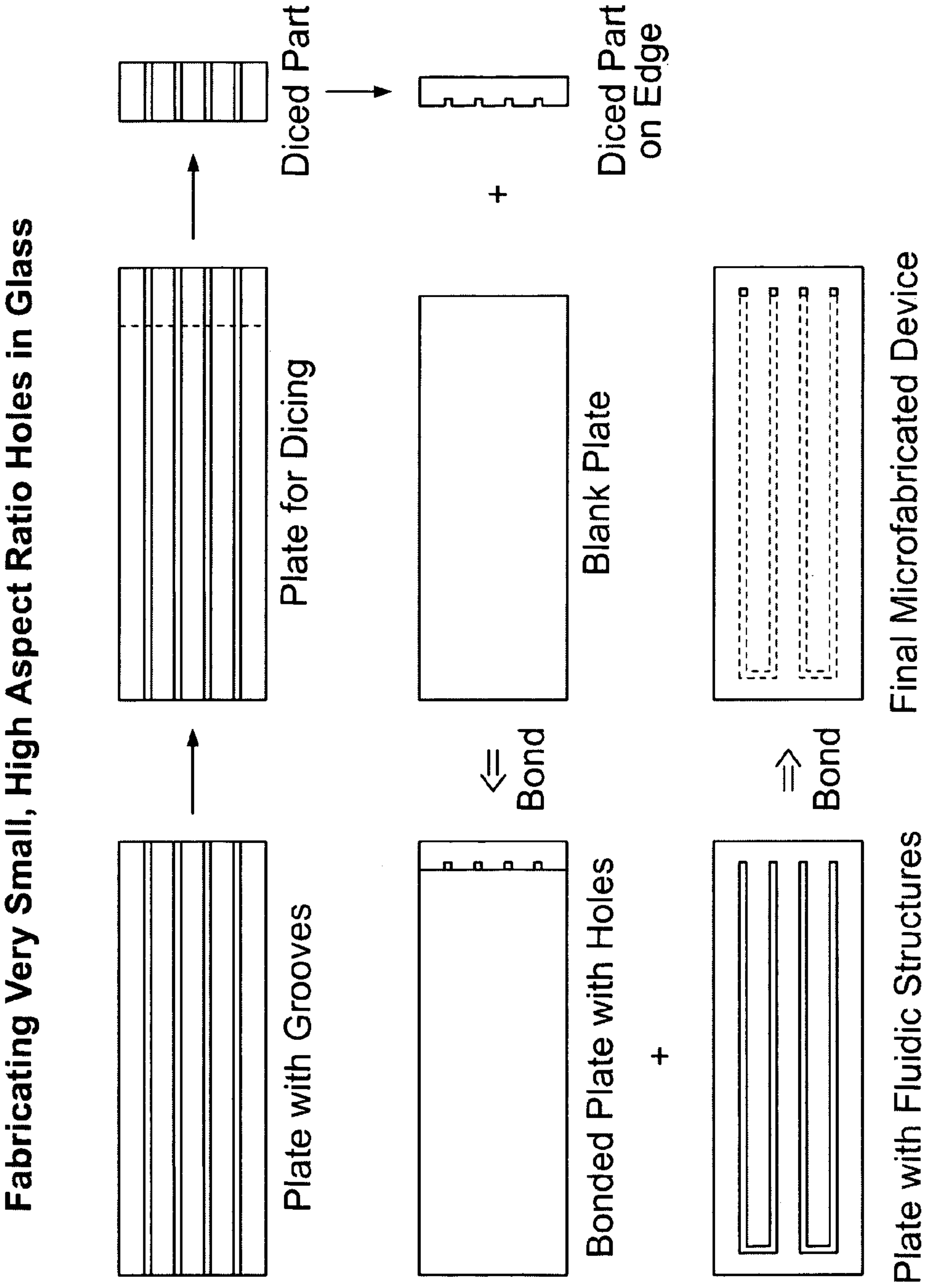
FIG. 8 shows a process for fabricating very small, high aspect ratio holes in glass, according to the present invention.

The process consists of a number of steps, as shown in FIG. 8. First, grooves were fabricated on the surface of a glass plate. Groove fabrication can be achieved by a variety of different methods, including sawing or etching. Alternatively, glass structures with drawn internal channels can be used. Next, short strips are diced off such that the grooves (channels) are oriented perpendicular to the diced edge. Then, one (or more) of these diced strips is tipped on edge and placed groove side against the previously flattened edge of a blank glass plate. Next, these two pieces are bonded at high temperature to form an integral part and then lapped, both sides, to insure flatness. Finally, this plate is aligned and bonded to another glass plate containing fluidic structures (channels) to form a complete microfabricated device. If required, additional holes of a more conventional size may be fabricated into either of the two plates before final bonding. One might also envision fabricating grooves on both sides of the starting plate prior to dicing and then bonding to two blank plates if two columns of holes are required. Drawn structures may include multiple columns as well.

To facilitate the modular mating of microchips, and also to facilitate connection to external hardware, channel spacing and connections can be standardized, for example to 1 mm, 1.1 mm, 1.2 mm, 1.3 mm, 1.4 mm, even 1.5, 1.6, 1.7, 1.8, 1.9 even 2 mm or more center-to-center, and standard channel configurations developed, i.e., through channels, channels connecting only to wells for loading and unloading, etc. The standardization will modularize microchip design and produce a toolkit of microfluidic modules on standardized sized microchips.

However, the channel dimensions of the mating chips do not have to match, depending on the application; if large channels are mated with smaller channels, alignment tolerances can be more relaxed.

Modular microchips of the present invention can comprise as few as one or as many as 2, 3, 4, 5, 6, 7, 8, 9, 10, 11, 12, 13, 14, 15, 16, 17, 18, 19, 20, 21, 22, 23, even as many as 24 channels open to an chip-interfacing surface or edge. In other embodiments, the modular microchips can include as many as 15, 50, even 75 or more channels open to a chip-interfacing surface or edge.

Such high density of channels is made possible, in part, by the modularity of the systems of the present invention. On monolithic microchips (that is, those in which the serial processes are integrated into a unitary fluidic microchip), an upper limit on the spacing and density of sample wells limits the number of fluidically noncommunicating channels on a wafer. With the modular microfluidic components of the present invention, loading wells can be moved to a separate chip, such as an injection chip; in such case, the number and density of fluidically noncommunicating channels can be increased. The loading chip can be large and have many wells, but the channels in the analysis microchip can readily all converge to an edge with microchannels, as illustrated in FIG. 19.

Figure 19:
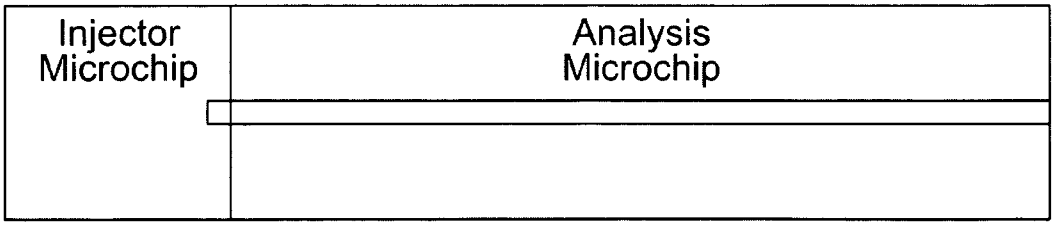
FIG. 19 illustrates a method to inject a plug of analyte into a capillary electrophoresis or other analytic channel on a modular fluidic microchip, according to the present invention.

FIG. 19 illustrates an exemplary direct injection method in which a small sample plug has been created in an injector microchip. The injector, made of conducting plastic or with an electrode at the bottom of the well, is moved into sealing engagement with the analysis microchip, and the small sample plug injected into separation matrix present within a separation channel in the analysis chip. In a second step, not shown, the injector microchip is then replaced with a run microchip, which can, for example, have a common reservoir or chamber for all channels. While FIG. 19 illustrates a single channel, in other embodiments multiple channels are used.

Additional features are usefully included in various embodiments of the microchips of the present invention.

Figure 17:
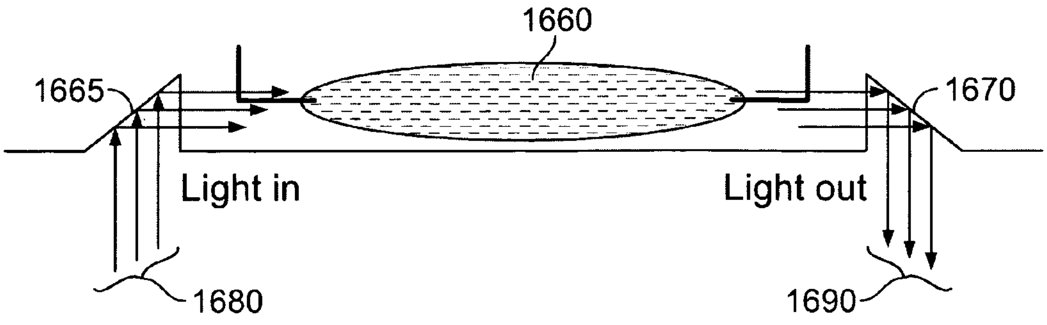
FIG. 17 shows the light path for detection of on-chip reactions using a long path length, according to an embodiment of the present invention.
Figure 18:
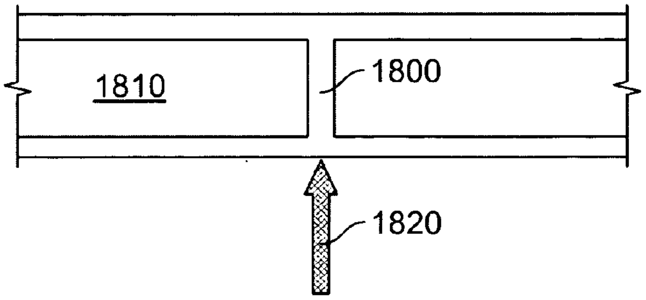
FIG. 18 shows the path of incident light during interrogation of a via channel within a fluidic microchip, according to the present invention.

For example, FIGS. 17 and 18 illustrate exemplary features useful for optical detection.

FIG. 17 shows an embodiment particularly adapted for real time PCR with optical detection, with a chamber 1660 modified to have a long axis, with beveled mirrored reflectors 1665 and 1670 to pass light 1680 into chamber 1660 and down the long axis and out as light 1690. FIG. 18 shows another embodiment, in which channel 1800 in microchip 1810 is positioned with its long axis coaxially aligned with incident light 1720, used to interrogate the sample in channel 1700. The light is propagated by internal reflection in the capillary channel, which serves to increase the light path length.

In addition, the modular fluidic microchips of the present invention can usefully include self-alignment features and embedded reference markings to facilitate manual and/or automated alignment during use. Active alignment features are usefully based on optical or mechanical sensors.

In another aspect, the invention provides apparatus for reversibly integrating a plurality of modular fluidic microchips, each containing at least one capillary channel, into a fluidically communicating system.

The apparatus comprises means for biasing each of a plurality of microchips towards at least one other of the microchips with sufficient bias to create a fluidically sealed interface therebetween, means for linearly moving at least a first of the plurality of microchips with respect to at least a second microchip to which it is reversibly sealed, wherein at least one of the capillary channels in the first and/or second microchip can be connected or disconnected across the interface by the relative movement. In various embodiments, the apparatus further comprises means for reversibly segregating one or more of the microchips in fluidic discontinuity from all others of the plurality of microchips.

In certain exemplary embodiments, further described below, the apparatus can accommodate two reversibly sealed microchips, creating a two microchip system such as those described in detail above. In other embodiments described in detail below, the apparatus can accommodate three microchips, each reversibly sealed to at least one other, to create three microchip fluidic systems such as those described in detail above. In yet other embodiments, the apparatus can accommodate more than three microchips in fluidically sealed arrangement. As further described below, the apparatus of any of these embodiments (2-chip, 3-chip, multi-chip) can usefully further accommodate additional microchips in a fluidically segregated location.

Figure 12:
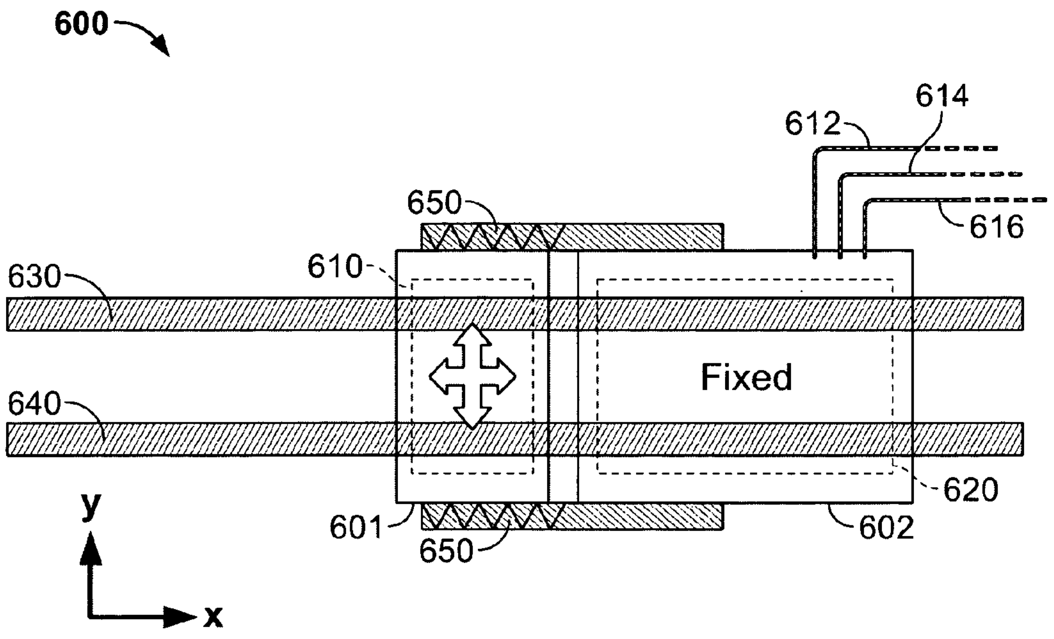
FIG. 12 is a schematic of apparatus for reversibly contacting a second fluidic microchip to a first fluidic microchip fixed thereon.

FIG. 12 is a schematic view of an embodiment of apparatus of the present invention suitable for integrating two modular fluidic microchips into a fluidically communicating system.

Apparatus 600 is shown loaded with two microchips, moveable microchip 601 and fixed microchip 602, the chips reversibly engaged on vacuum chucks 610 and 620.

Fixing the motion of one of the two microchips achieves certain advantages, such as facilitating the integrated fluidic system's interaction with external devices, such as through syringe pump line 612, pressure line 614, and vacuum source line 616. In such embodiments, microchip 602 is reversibly fixed, and can be removed from the apparatus by release of the vacuum in vacuum chuck 620. In other embodiments, both microchips are moveable during operation.

The vacuum chucks are movably engaged on guides 630 and 640. In certain embodiments, not shown, the vacuum chuck further contains a heating element to maintain the microchip at a set temperature, such as 50° C. or more, for improved separation quality.

In operation, after microchip 601 and microchip 602 are loaded on their respective vacuum chucks and aligned, either manually or automatically, apparatus 600 can move microchip 601 against fixed microchip 602, effecting a fluid tight seal across the interface.

Microchip 601 is moveable in both the x- and y-axes. X-axis movement can be effected by movement of vacuum chuck 610 along guide rails 630 and 640.

Chuck movement along guide rails 630 and 640 can be effected using any known method. In some embodiments, for example, chip movement can be effected using stepper motors to move vacuum chuck 610 in the x-axis along guides 630 and 640. In other embodiments, x-axis movement can be effected via spring loaded pneumatic actuation, as, e.g., by pneumatic springs 650. In these embodiments, pneumatic actuation moves microchip 601 to the left to undock from microchip 602, while springs exert an oppositional "preload" to the right to achieve docking pressure when the pneumatic actuation is released: that is, the application of pressure to the spring-loaded pneumatic devices 650 can overcome the spring force and move the two microchips apart to undock the microchips.

When the microchip 601 is undocked by pneumatic actuation, it is free to move in the y axis using an automated linear stage.

The spring force in pneumatic springs 650 is chosen in relation to the microchip design and the surface area. A 2 lb spring force is sufficient to create seals of approximately 100 psi, sufficient for good microfluidic seals.

Microchip 601 can also be precisely moved in the Y axis by a stepper motor or other actuator (not shown) to effect linear movement of chip 601 with respect to chip 602; as described in detail above, the movement coaxial to the chip-chip interface is such that at least one of the capillary channels in the first and/or second microchip can be connected or disconnected across the interface by the relative movement, forming valves or routing liquids to new channels.

The y-axis movement can be driven, for example, by a commercially available automated stage, for example a stage having a 20 mm range and a 1 μm positional accuracy using an optical encoder.

Liquids can be supplied to either microchip through syringe pump line 612 and pressure and vacuum supplied, respectively, through lines 614 and 616 to introduce and move samples, separation matrices, and to regenerate the reusable separation microchip.

The x-axis pneumatics and the y-axis stage can usefully be controlled by software, such as LabRAT software available from Silicon Valley Scientific Inc., further described below.

In another embodiment, both microchips might be movable in X and/or Y axes. Such embodiments may prove preferable when the chips provide sample preparation and processing functions, while embodiments having a fixed microchip may prove preferable for analysis and detection. Z axis movement (not shown) can also be used to dock and undock microchips that have multiple layers, and fluid interconnects on different layers.

Figure 20:
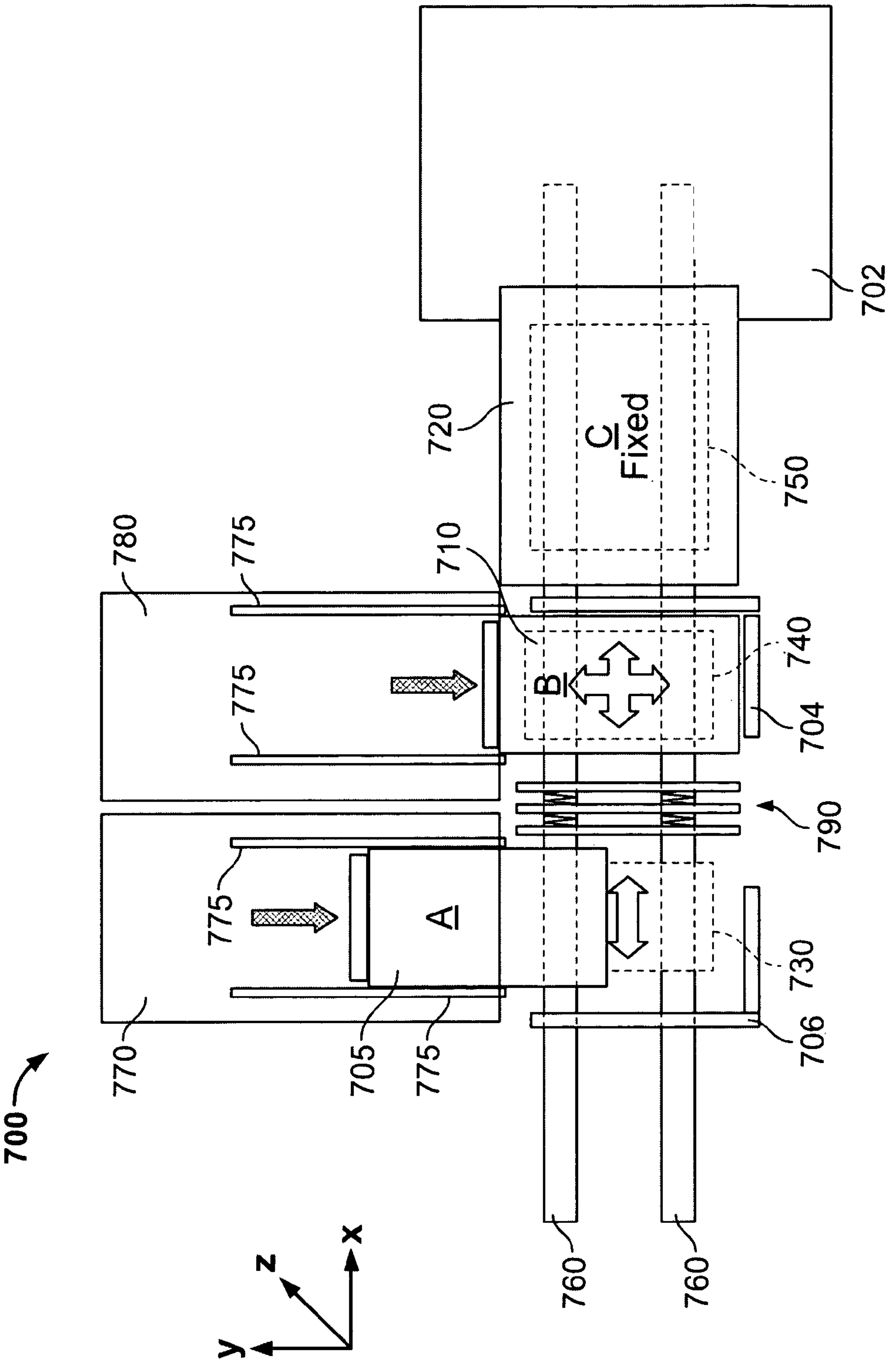
FIG. 20 is a schematic of apparatus for bringing up to three fluidic microchips into operable contact, the apparatus further including housings (hotels) for reversibly storing microchips prior to, during, and/or after a desired reaction, and mechanism for moving microchips into and out of the housings, according to the present invention.

FIG. 20 is a schematic view of an embodiment of apparatus of the present invention suitable for integrating three modular fluidic microchips into a fluidically communicating system. The exemplary apparatus is additionally capable of reversibly and independently segregating two of the microchips in fluidic discontinuity from all others of the plurality of microchips.

Apparatus 700 contains three microchips, 705, 710, and 720, that are reversibly mounted on fixtures 730, 740, and 750, for example by application of vacuum. The fixtures are, in turn, mounted on rail linear guides 760 that define an x-axis. In typical embodiments, the fixtures have vacuum chucks and optional alignment registrations for microchips. The rightmost microchip 720, typically the analysis microchip, is in this embodiment fixed in all directions during use; as in the two chip embodiment described above, fixing one of the chips facilitates interaction with external devices and, in addition, simplifies alignment and separation optics.

In this embodiment, fixed microchip 720 is connected to waste reservoirs with vias through the bottom of the microchip (not shown) as well as to pressure sources and reagents through vias in the top or bottom of the microchip (not shown). By bringing microchip 710 into sealed fluidic contact with chip 720, and microchip 705 into sealed fluidic contact in turn with chip 710, fixed microchip 720 can supply these "services" to the microchips integrated into the system as needed.

In the exemplary embodiment schematized in FIG. 20, the middle microchip 710 can move in the x-axis, along the length of guides 760, and can also move in the y-axis, perpendicular to the guides. In contrast, the left-most chip, 705, can move only along the x-axis. In other embodiments, not shown, the leftmost microchip 700 can move along both x and y axes.

Figure 21:
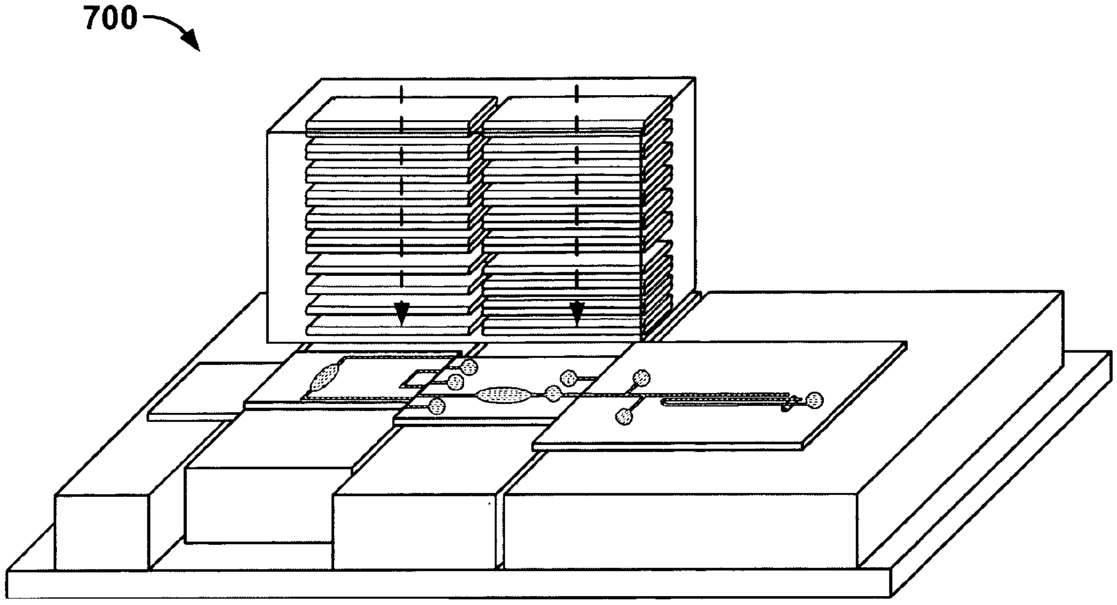
FIG. 21 is a top perspective view of apparatus similar to that schematized in FIG. 20.

Apparatus 700 further comprises means for reversibly and independently segregating two of the microchips in fluidic discontinuity from all others of the plurality of microchips. In the embodiment shown, moveable microchips 705 and 710 can be moved into and out of housings 770 and 780 ("hotels"). Movement into and out of the hotels will involve movement, in various embodiments, along the y-axis and/or z-axis. FIG. 21 is a top perspective view of apparatus 700 illustrating z-axis movement of chips within the hotels.

In exemplary use, microchips 705 and 710 are delivered, respectively, from hotels 770 and 780 to active positions on fixtures 730 and 740. After delivery of the microchip, spring guide 790 and fixtures 706 and 704 align the microchips.

In typical embodiments, microchip 705 is moved from hotel 770 along a pair of microchip guides 775. In some embodiments, microchip 770 is pushed with a push-bar; in some of these embodiments, the push-bar is integral to the microchip hotel. In other embodiments, a mechanical or vacuum gripper may be used. Devices for delivering chips to precision analytical instrument from storage areas are known—see, e.g., U.S. patent application Ser. No. 2003/0180128—and can be adapted for use in the apparatus of the present invention.

As shown in the exemplary embodiment of FIG. 20, microchip 710 is loaded from hotel 780 prior to loading of chip 705 from hotel 770. As shown, microchip 710 is loaded into approximate position by pushbar 776; alignment fixture 704 has been positioned to allow pushbar 776 to seat the microchip against the hotel-distal and fixed-chip proximal part of fixture 750 before spring guide 790 applies pressure to finish seating microchip 710.

Once microchip 710 is properly seated, a vacuum chuck (not shown) is activated to firmly hold the microchip in place within fixture 750. The fixtures, vacuum chucks and microchips may also include spring-loaded alignment features.

In an alternative series of embodiments, microchip 705 is loaded before microchip 710. In these embodiments, microchip 705 is aligned against fixture 706. Microchip 710 would then be loaded, but instead of aligning with the vertical part of the alignment fixture 704, microchip 710 would be aligned by spring guide 790 against the left edge (as shown) of microchip 720. A light vacuum is applied during the alignment to hold the chip in place before full vacuum to fix the position. Microchip 705 is then aligned by spring guide 790 against the left edge of microchip 710. Another, at present less favored alternative, is to actively align the microchips based on sensing the microchip position.

At the time of delivery from the respective hotel, the interfacing edges of one or both of microchips 705 and 710 can, in some embodiments, be sealed, such as by a layer of perforated thin film; the film functions to eliminate cross contamination at the ends of channels and serves as a gasket to assist in the sealing once the chips are brought into sealing engagement.

Once a microchip is "filled" with reactants—either through fixed chip 720 as shown, which is useful for a lower throughput device, or through use of a loading station, typically for a high throughput device—the filled microchip can be kept in place on apparatus 700, or in higher throughput embodiments, moved to a temperature and optionally humidity controlled hotel that optionally seals the ends, for off-line incubation.

Once all microchips are loaded, at least chip 710 can be precisely moved along the Y axis, such as by stepper motor or other actuator, to effect its linear movement with respect to both chip 705 and fixed chip 720; as described in detail above, the movement coaxial to the chip-chip interface is such that at least one of the capillary channels in the first and/or second microchip can be connected or disconnected across the interface by the relative movement, forming valves or routing liquids to new channels.

Apparatus 700 can include automated stages that hold microchips, external pneumatics, syringe pumps, microchip cassette hotels, devices to regenerate the microchips that function as separation modules, not shown in FIG. 20. In addition, apparatus 700 can comprise detection device 702. Detection device 702 can employ optical, fluorescence detection, Raman, or other optical detection methods, mass spectroscopy, or comprise other detectors.

The ability to allocate various functions to apparatus 700 in the systems of the present invention—such as provision of power, vacuum, or pressure to the chips, or to provide detection means—facilitates manufacture of the microfluidic chips. The ability to offload such functions is, in turn, facilitated by the modularity of the system.

In one exemplary use of apparatus 700 (or apparatus 600, described herein above), microchip 720 (or, respectively, microchip 602) can provide sample separation functions, the separated sample thereafter moved into a mass spectrometer for analysis.

In various embodiments, the hotels can hold several microchips to thousands of microchips, or more, depending on the application and throughput requirements. The microchips need not all be the same type and may include differing chemistries, depending on the application desired.

Thus, apparatus 700 is able to perform multiple assays.

Typically, apparatus of the present invention will be supported by a hardware system with software control; in certain embodiments, analysis software is also integrated into the apparatus. Given the variety of assays made possible by the modularity of the approach, the hardware and software will typically provide the functionality to prepare samples and analyze them with a flexible workflow, interpret and report the results in real-time, and initiate the next action. Because the workflow is flexible, staged testing will be possible and new microchips can be readily incorporated to create new workflows.

For example, in embodiments of the apparatus of the present invention capable (with appropriate microchips) of performing PCR amplification or cycle sequencing with on-board fragment analysis, the apparatus will typically include the following subsystems: precision microchip movement; microchip hotels; external actuation; sample external interface; temperature control and cycling; detection; fill-flush microchip regeneration.

In one series of embodiments, the apparatus has four main components: (1) microchip handling, comprising precision microchip movement subsystem and microchip hotel subsystem; (2) instrument control, including interfacing with external devices, the microchip fluidics, environmental control, and thermal cycling; (3) optics; and (4) software. The software system, as further described below, can usefully be based upon the existing LabRAT (Laboratory Rapid Automation Toolkit, Silicon Valley Scientific Inc., Fremont, Calif.) software development system for control, an analytical package, and a command and control subsystem.

The precision microchip movement subsystem in these embodiments is involved in precision movement and handling for microchip positioning and alignment. Exemplary microchip movement subsystems capable of moving chips in the X-axis, Y-axis, and Z-axis are described above.

In embodiments of the apparatus of the present invention that comprise means for reversibly segregating one or more microchips in one or more "hotels", so as, for example, to permit reaction incubations that require more time than others of the process steps, a microchip hotel subsystem will typically be included. The subsystem will typically effect microchip movement to the vacuum chucks on the fixtures, align the chips automatically and reliably, to permit the chips thereafter to be held accurately in place on the vacuum chucks on a pair of parallel rails. Such chip movements can be simplified by standardization of microchip sizes and fluidic interfaces.

The microchip hotel subsystem can function as an indexed storage unit that can present a microchip from any position to the vacuum chucks. The microchips can be selectable and presented to a standard position as an interface.

In exemplary embodiments, the hotel would move in the z-axis to move the proper microchip in place before a slide or push-bar presented it, as schematized in FIG. 21. Typically, sensors will allow for error trapping and recovery. In certain embodiments, the hotel accommodates one or more microchip cassettes, each cassette holding 10 or more microchips; the cassettes are designed for rapid insertion in the hotel.

In certain useful embodiments, the cassettes include sides formed of a compliant material, such as silicone, that can be pressed against the microchips to seal them during storage and incubation within the hotel. The seal on the sides is, in preferred embodiments, sufficient for thermal cycling or high temperature incubations without loss of sample volume.

Consistent with the desire to move complexity off the microchips to facilitate both manufacturing and modularity, the apparatus of the present invention can, in some embodiments, include an external actuation subsystem. The external actuation subsystem is used to motivate movement of microfluidic samples in the microchips.

Depending on the functions to be performed, liquids can be motivated to move through the channels of the microchips using any of the well-known microfluidic approaches, including application of pressure, vacuum, through capillary action, application of electrical potential, electrokinetic approaches, electroosmotic effects, etc.

For example, for sample preparation, fluids can be moved by applying external pressure in the low psi range or by applying vacuum. In some embodiments, the pressure or vacuum can be applied through a disposable air-permeable membrane to prevent contamination of the actuator; the membrane can be on a roll and advance after each test. The pressure or vacuum can be delivered through a manifold to an array of effectors containing the lines, one for each multiplexed channel. In various embodiments, the effector clamps down on the microchip under biasing force, e.g. spring force, with "O" rings creating the seals.

Vacuum or pressure are typically, but not invariably, controlled by normal full scale elements, under computer control. Syringe pumps attached through fittings to the microchip can precisely move liquids. For electrophoresis, an electrode board can mate with the appropriate wells when desired; alternatively, electrodes can be built into the microchips and run to edge or bus connectors. The electrodes are controlled by programmable power supplies with four independent outputs.

When desired, liquids can also be metered by active control of syringe pumps.

If aliquots are needed, they can be formed by methods similar to Anderson et al., *Nucl. Acids Res.* 28: E60-e60 (2000), the disclosure of which is incorporated herein by reference in its entirety, wherein a channel leads to a via that is externally sealed with a gas permeable, but liquid impermeable membrane.

Figure 14:
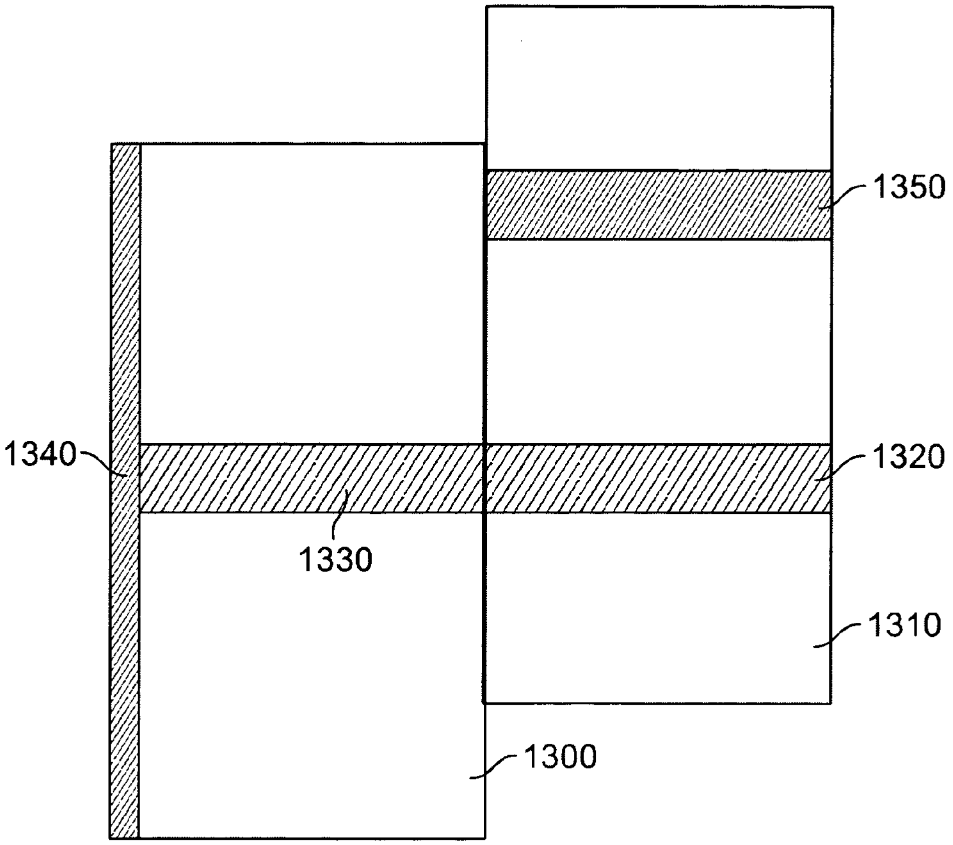
FIG. 14 shows a first and second slideably edge-joined modular fluidic microchips, with a non-liquid permeable membrane operably attached to the first microchip, according to the present invention.

FIG. 14 shows a first and second slideably edge-joined modular fluidic microchip of the present invention with a non-liquid permeable membrane operably attached to the first microchip; this arrangement is suitable for forming an aliquot of predetermined volume.

Microchip 1310 is shown sealingly appressed to microchip 1300, bringing channel 1320 into fluid communication with channel 1330. Channel 1330 leads to membrane 1340 which, in this embodiment, is gas permeable but liquid impermeable. After fluid is pumped down channel 1320 and into channel 1330, an aliquot is created having the volume of channel 1330. The measured volume can be moved back into channel 1350 by moving microchip 1300 so as to bring channel 1330 into fluid communication with channel 1350 and applying air pressure to membrane 1340 to move the measured aliquot into channel 1350.

The modularity of the systems and methods of the present invention, in which microchips are reversibly, movingly, and sealingly engaged to one another, permits membranes to be applied to an outer surface of a microchip, thereafter as desired to be internalized between two or more microchips within an integrated fluidic system. This solves a significant difficulty often encountered with monolithic fluidic microchips (that is, fluidic microchips in which a plurality of process steps are permanently integrated), in which permanent bonding of membranes, particularly internally disposed membranes, has presented problems.

In the systems and methods of the present invention, membranes can also be moveably docked with arrays of capillaries, such as those described in U.S. Pat. Nos. 6,190,616 and 6,551,839 and U.S. patent application publication no. 2004/0017981, the disclosures of which are incorporated herein by reference in their entireties.

Such membranes can function as liquid impermeable barriers as above-described, and in addition or in the alternative possess chemical, affinity, catalytic, or other characteristics desirable to manipulate biomolecules in solid phase or mixed phase reactions, including restriction digests, tryptic digests, etc. Modular microfluidic membrane holders designed to be compatible with the microfluidic chips of the present invention simplify handling of membranes in the integrated systems and methods of the present invention.

Typically, the apparatus of the present invention will include a sample external interface subsystem.

The sample external interface subsystem interfaces with the outside world, bridging the nanoscale to microscale. For a field detection instrument, typical sample input is a lysed and concentrated sample in liquid from air sampler. If the interface is with a flowthrough system, the tubing is typically plumbed into a moveable pod that can dock with either the end of the microchip or with a reservoir. For laboratory devices that must access samples in vials or microtiter plates, a capillary will, in typical embodiments, dip into the sample and through a modular connection to deliver the sample to a microchip. With modular microfluidics, an array of 12 capillaries are capable of sampling 12 wells and connecting to a microchip with 12 channels.

Also in keeping with moving complexity off the microfluidics, typical embodiments of the apparatus of the present invention will include one or more temperature control subsystems capable of effecting thermal cycling and temperature regulation. The heating mechanism and thermocouples can be mounted on the instrument or on the chips. Heat can be achieved through external resistive heating, air-based cycling, Peltier units, IR heaters, and loops through constant temperatures. A "positionable, heated finger" is possible in embodiments in which a local heating element is moved to a fixed microchip position.

Apparatus of the present invention can usefully comprise one or more detection subsystems. Many such detection systems are compatible with the modular microfluidic systems and apparatus of the present invention.

In one embodiment, an optical detection system can monitor fluorescence from end-point assays for PCR, real time PCR, or fragment analysis. Diode lasers and a "staring" CCD detector can provide the illumination and detection elements. Other lasers, white light, or other light sources are possible, and PMTs, APDs, and SPADs provide alternate detector embodiments.

Fiber optic illumination delivery and collection can be designed to provide a high numerical aperture collection lens, microlenses on the microchip or fixture, and improved electronics. For sequencing, four-color detection can be achieved by spectrally spreading the epi-fluorescent light onto the CCD or through filtering for PMTs. Construction of four color detectors is well known to those skilled in the art.

The integrated microfluidic systems of the present invention can also use mass spectrometry for detection.

In these embodiments, the modular microfluidic system can prepare a sample—for example, by affinity purifying a protein sample, or performing two stages of separation as, e.g., is performed in standard 2-D gel electrophoresis—within the reversibly mated microfluidic chips. The modular microfluidic microchip then docks with an electrospray injection system to introduce sample into the mass spectrometer. The modular microfluidic system could, in alternative embodiments, deposit material on MALDI or SELDI probes for laser desorption ionization mass spectrometry.

In other embodiments, the systems and apparatus use DNA arrays as detectors. In these embodiments, the sample is prepared in the integrated modular microfluidic microchips and then moved onto a DNA array as a detector. Similarly, protein arrays and other arrays, including libraries of materials such as combinatorial or natural product libraries, can be used a detectors.

Apparatus of the present invention can, in certain embodiments, include a fill-flush microchip regeneration subsystem.

For a fixed or reusable modular microfluidic chip, the microchip will be need to be regenerated, which may entail cleaning the microchip. In some embodiments, microchips can be refilled using a "tube-in-tube" array manifold with a completely automated fill and clean module with an array manifold. Solutions are flushed through the microchip to clean and regenerate the microchip. Separation matrix, gels, beads, affinity material, or other material can also be added to the modular microfluidic microchip during this process. Software to control the fill/flush module can be used.

Many, if not most, embodiments of the apparatus of the present invention will include software control of hardware elements. In some of these embodiments, the apparatus itself includes a software subsystem.

The software can be conceptually divided into three basic levels: instrument control software, system coordination software, and data storage, analysis, and bioinformatics services. Software for the system can be developed from the existing LabRAT code base, a proven instrument control platform, or other software frameworks.

Modeling can be done in UML (the Unified Modeling Language) and the models implemented in C++, Java, and state-of-the-art middleware, with a focus on modularization and testability. Each functional hardware element of the system can be represented as a software component—each modular hardware component representing an "instrument" whose functionality is reflected in software. This includes all necessary drivers and "servers" for hardware elements of the system (e.g., stages, pumps, pneumatics, etc.). Data analysis and data storage modules are represented as "virtual instruments" that reflect the same interface and "plugability" as instrument modules, allowing code reuse, and efficiency of design and testing. A LIMS module can be interfaced to provide functionality for sample tracking. Control and scheduling modules can be designed to implement the overall process.

LabRAT software (Silicon Valley Scientific, Inc.) or equivalent software can be used as the basic "operating system" for a modular microfluidic instrument. This software can serve as a framework for instrument control and scheduling of operations, as well as for error detection and handling, along with the primary user interface. The software, as adapted for use with the integrated modular microfluidic system of the present invention, can have additional functionality, including improved security for data interchange. Currently the LabRAT protocol relies upon SSL (Secure Sockets Layer) for data security. While this allows for secure transactions between two system nodes, more complex interactions (see "Command and Control Interface" below) may require features such as audit trail capability and guaranteed delivery. The newly proposed XML Signature and XML Encryption standards from the W3C organization can provide the basis for such improved functionality.

Integration of data analysis and bioinformatics services using LabRAT virtual instrument nodes provides a pluggable, quickly reconfigurable analysis architecture for modular microfluidic systems and apparatus of the present invention. In one embodiment, the analysis tools include a general visualization package for real-time PCR and fragment length analysis based on the Genetics Profiler Package (GE Healthcare, Piscataway, N.J.). Optionally, a Laboratory Information Management System (LIMS) is connected to track data.

Data analysis software optionally provides complete data analysis functionality, simplifies the piping of data and helps tune both the nanoscale sample preparation and the DNA analysis modules.

In one embodiment particularly useful for genetic analysis with capillary electrophoresis (CE) separations, the analysis software is based upon MegaBACE LabBench and Genetic Profiler software (GE Healthcare, Piscataway, N.J.), for the processing of raw data, spectral separation, and base or allele calling or equivalent software. The is tuned to work with microchip data, which has more scans per peak, requires different filtering parameters than capillary array electrophoresis (CAE) data.

In various embodiments, integrated software with bioinformatics is included within the analysis system.

The software is designed with modular components for environments that minimize or eliminate operator intervention. Sample tracking, display of primary and processed data, automated fragment analysis and basecalling, export of standard format files, and scripting of other processes is automated. The complete software system seamlessly fits into a wide range of host information technology environments.

In LabRAT-based embodiments, the distributed nature of the LabRAT software architecture, and the fact that all modules communicate via standardized web service TCP/IP protocols, the software readily interfaces between an instrument installation and external software. For example, the external software may be in a hospital, clinical laboratory, research lab, high level command and control software operated by local agencies or by National Homeland Security centers. In addition, data can be exported for monitoring results and allows for intercommunication between system installations; off site requests are, in some embodiments, enabled to alter testing protocols and frequencies if alert levels increase or if positives are found locally or in neighboring instruments.

Applications

Applications for the modular microfluidic chips, integrated fluidic systems, apparatus and methods of the present invention include, but are not limited to, the areas of genomics, proteomics, molecular diagnostics and cell based assays. Examples, some of which are further described herein, include sample cleanup and purification, PCR, cycle sequencing, sample dilution, sample concentration, and isothermal, enzyme or ligand binding assays. Multiple reaction steps may be performed. Samples may be prepared for detection by mass spectrometry. In addition, applications exist in fields outside of life sciences.

The modular microfluidic chips, integrated fluidic systems, apparatus and methods of the present invention are capable of implementing a wide range of applications, chemistries, biochemistries, processes, and analyses. The following examples are just some of the wide range of applications that can be implemented on modular microfluidic microchips. It is important to note that the sample preparation on modular microfluidic microchips can be for on-chip analysis or moved off-chip for analysis with different instrumentation such as CAE, mass spectroscopy, microarrays, optical or other analytical methods. The examples are not meant to limit the invention scope but to illustrate specific examples of how modular microfluidic microchips can be applied to develop genomic, proteomic, and metabolic assays.

PCR Analysis on Modular Microchips

PCR can be readily adapted to modular microfluidic microchips of the present invention. As adapted to the fluidic microchips, systems, methods, and apparatus of the present invention, PCR can provide evidence for the presence of pathogens as well as quantify the number of organisms, such as viruses, by RT-PCR, provide amplified sample for analysis of VNTR, MLVA, and AFLP and can produce defined templates for supplemental analyses, such as by cycle sequencing.

The heating device can be selected from most devices used to heat and cool a substrate, including an external resistive heater such as a nichrome coil; a Peltier device; flowing air, gas, water or other liquids past a device; rapidly moving a microchip from one thermal zone to another; IR heating; heating by alternating current; or other methods well known to function at the macroscale, microscale or smaller dimension.

Usefully, feedback from a temperature measuring device such as a thermocouple and control software control the temperature regulation to thermally cycle or maintain an isothermal or other profile.

In some embodiments, PCR is modified to accommodate the modular microfluidics of the present invention. Such modifications include, for example, altering the concentration of primers and $Mg^{2+}$; including additives such as BSA, betaine or other additives to decrease absorption to the walls as the reactions are miniaturized; re-optimizing thermal cycling conditions to minimize offsets in set and actual temperatures, and optimization of key reagent concentrations (DNA, primers, polymerase, DNA to enzyme ratio, and MgCl) for microchip reactions, and coating of the channels. Multiplexed PCR reactions—such as those described in U.S. patent application publication nos. 2003/0096291 and 2003/0104459, the disclosures of which are incorporated herein by reference in their entireties—can be implemented to further increase the throughput or information content of reactions.

In some embodiments, stabilized reagents are used. In some of these embodiments, stabilized PCR reagents can be pre-dispensed into the reaction chambers of modular microfluidic devices. As an example, Ready-to-Go® (RTG) stabilized reagents (GE Healthcare, Piscataway, N.J.) can be used; as commercially available, these kits provide complete PCR reagents including stabilizing carbohydrates, specific primers, premix, and polymerase in a dehydrated form. The reagents are stabilized almost indefinitely at room temperatures by the carbohydrate film until dissolved by adding template DNA. To adapt RTG to microchips, RTG beads can usefully be re-dissolved, the microchip wells coated, and flash-frozen and dried at the bottom of microchip wells, in reaction chambers, in channels or other locations.

In other embodiments, real time PCR and/or quantitative PCR (qPCR) can be performed, using standard curves or other methods of calibration to provide quantitative measurement of starting concentrations of template.

PCR reactions can, in some embodiments, be modified to use molecular beacons, TaqMan, or other fluors or reporters that perform (fluorescence resonance) energy transfer or quenching reactions or other methods that quantify template starting concentration.

The use of modular microfluidic microchips provides an additional benefit that the PCR reactions can be performed in multiple microchips and then the endpoint read by moving a microchip onto a fluorescent reader. In an alternative embodiment, the monitoring of fluorescence or other readout can be monitored in a continuous or interval manner by reading directly off of the microchip. Another embodiment performs the PCR amplification with labeling in a modular microfluidic microchip of the present invention and then performs a separation such as capillary electrophoresis, mass spectroscopy, liquid chromatography or other separation methods to separate the products and quantify the amounts.

Rolling Circle Amplification on Modular Microchips

Rolling circle amplification is a technique using a DNA polymerase to replicate DNA in a circular template. Presently phi29 polymerase is used in commercial products. Rolling circle amplification can be used in either linear or exponential amplification mode depending on the primer sets supplied to the DNA polymerase. While rolling circle amplification is a powerful technique that can amplify from single cells and low copy numbers, it produces a very large molecular weight product that has a large physical size compared to microchannels, which can clog microchannels, thereby hindering its adaptation to microfluidic systems.

The modular microfluidic microchips of the present invention provide a solution.

A disposable sample preparation microchip is loaded with the rolling circle amplification mixture and DNA is added. Alternatively, the complete mixture of DNA, DNA polymerase, and reaction buffers and substrates are premixed and added. The complete reaction is moved into a reaction chamber and incubated at the appropriate temperature. Typically, room temperature is adequate and reaction times are 4 h to 18 h.

The long incubation time would provide a rate-limiting block to throughput in a monolithic microfluidic device, where the downstream processes would be kept waiting for the upstream amplification process. In the methods of the present invention, the chip within which amplification is performed would be reversibly segregated from the others of the microfluidic chips during the reaction.

After the amplification reaction is complete, typically a second reaction, such as genotyping or cycle sequencing, is performed.

Because the high molecular weight rolling circle amplification product may be hard to move within a channel or chamber, using the modular microfluidic microchip system of the present invention the reaction microchip can dock with a station that injects the next reaction mix and enzyme into the first reaction chamber, the reaction then proceeding in the chamber where the rolling circle reaction has taken place.

The second reaction produces lower molecular weight products that can be moved using pressure, electrokinetics, electroosmotics, or other well-known microfluid motivating means into another channel.

From the channel the sample can either be collected and analyzed off-chip by CAE or other analytical methods or moved to a second microchip using modular microfluidics for analysis on-chip by CAE using a twin-tee injector or other analysis method.

In an alternative embodiment, the second reaction is analyzed in place if separations are not required. The microchip containing the rolling circle amplification product can then be discarded or cleaned off-line by methods that digest the large rolling circle amplification product or that fragment it for removal and reuse of the chip if desirable.

Cycle Sequencing Sample Preparation on Modular Microfluidic Microchips

For DNA sequencing, cycle sequencing sample preparation can readily be implemented on modular microfluidic microchips. This will produce samples with volumes from 20 μL down to several nanoliters or less and make increased throughput affordable for users.

Cycle sequencing can be performed on modular microfluidic microchips using dye-terminator or dye-primer chemistries well known in the art. Samples can first be amplified on-chip and analyzed on off-chip in CAE instruments.

For example, in one implementation, dye-terminator sequencing reactions can be used on modular microfluidic microchips essentially according to the manufacturer's specified protocols using DYEnamic™ ET Terminator Sequencing Kits with only slight optimization. Reagents are cycled at 95° C. for 25 s, 50° C. for 10 s, and 60° C. for 2 min for 30 cycles. On-chip thermal cycling can be performed using thermal cycling methods including Peltier heaters, external resistive heaters made from nichrome coils, air-based thermal cyclers, contact fluid thermal cyclers such as "dunking" and switching sources of circulating water or other methods well known in the art.

Temperature control is by software such as the NanoPrep thermal cycler control system with sensing by thermocouples, fluorescent reports such as the Luxtron instrument uses, or other means. Thermocouples can be inserted into a hole in the microchip. Since the thermocouples are not inside the sample chamber, a range of temperatures can empirically determine the offset and optimum. The number of amplification cycles, the temperature profile, and the concentration of different reactants, i.e., primers, polymerase, dNTPs, ddNTPs, etc, are individually optimized.

Buffer additives such as BSA or PVA which can decrease surface effects that remove reactants from the reaction mixture may be added. The surface chemistry of the reaction chambers can be altered using, for example, modified LPA or PEG coatings. For glass, an alternate approach is multipoint covalent attachment of the polymers such as polyethers and oxidized polysaccharides to many surface sites simultaneously, thus extending the lifetime of the surface immobilization since many sites must be hydrolyzed to free the polymer.

The prepared samples can be analyzed "off-chip" in CAE instruments. CAE instruments are capable of detecting sample prepared in 10 nL of sample volume when injection conditions are optimized for small volumes. The samples can provide low volume reactions to feed the CAE throughput.

After thermal cycling, for off-chip analysis, samples can dispensed from the microchips into 40 μL of 80% ethanol at room temperature in a microtiter plate by air pressure. For ethanol post-processing, the samples can be centrifuged at 2,800 RCF for 5 s and the alcohol removed by a brief inverted spin for 30 s at 50 RCF. The samples are resuspended in 10 uL of double distilled water. The samples can be subsequently injected into the 96-capillary MegaBACE instrument using a 10 kV, 15 s injection and separated using a 120 V/cm field strength. The separation matrix can be 3% linear polyacrylamide (MegaBACE Long Read Matrix, Amersham Biosciences) with a running buffer of Tris-TAPS (30 mM Tris, 100 mM TAPS, 1 mM EDTA, pH 8.0). Four-color electropherograms can be processed using the Sequence Analyzer base-calling software package with the Cimarron 3.1 basecaller (Amersham Biosciences) and the Phred base-calling script. Separations are optimized for injection time, injection voltage, and loading conditions.

In another embodiment, cycle sequencing or genotyping samples can be analyzed by mass spectroscopy. In this method, the length and molecular weight are analyzed to determine the identity of the fragment, particularly for short genotyping reactions.

After thermal cycling for on-chip analysis, samples can moved in modular microfluidic microchips from the sample preparation area to a "twin T" injector for on-chip CAE analysis. With on-chip sample preparation can also be combined with on-chip sample cleanup to improve the capillary electrophoresis.

Sample Cleanup on Modular Microfluidic Microchips

A major advantage of sub-microliter sample preparation volumes is that many techniques that are unaffordable at the macroscale can be economically applied to nanoscale samples. Using modular microfluidics, sample cleanup functionality can be provided on a microchip and then the sample moved onto another microchip for analysis.

The cleanup technology can use beads, particles, monoliths, mini-chromatography, affinity chromatography or other methods well known in the art to purify samples either before sample preparation to remove impurities in the sample; to concentrate or after sample preparation; to remove by-products, reagents, or buffers; to concentrate samples before further processing or analysis; or other applications. The samples can be analyzed on-chip by CAE or moved off-chip for CAE, MS, optical imaging, or other analyses.

For example, in one embodiment, for the cleanup of DNA sequencing reactions, the sample cleanup can be implemented using commercially available beads (Agencourt, Dynal, or other vendors) or solid phase beads with custom chemistries on their surface. The chemistries can range from absorption, ion exchange, affinity interactions such as antibodies or biotin, or other chemistries well known in the art. For example, briefly, SPRI beads (Agencourt) are loaded into a channel with a weir to constrain bead flow. The cycle sequencing reactions are then loaded onto the beads and washed with 100% EtOH. After incubation, the beads are washed with 70% EtOH and then the cycle sequencing products eluted with formamide. The concentration of the eluted sample will be kept to a minimal volume of less than 50 nL to keep the samples concentrated enough for injection with a twin tee injector.

In another embodiment, applications of solid phase chemistries on beads, including paramagnetic beads, are used. In another embodiment, affinity purifications can be performed using biotinylated primers, bound antibodies, nucleic acids, or related affinity techniques well known in the art. In this method, primers with biotin on the 5'-end will be loaded onto streptavidin-coated surface and the primers and products bound. The template, salts, and unincorporated nucleotides are washed off before elution of the desired products.

In another embodiment, affinity cleanup methods are used in the modular microfluidic. Acrylamide gels with affinity capture reagents such as antibodies or nucleic acids can be used to capture specific molecules. The affinity capture matrix can collect multiple targets into one sample, as will be needed for MLVA.

In another embodiment, monolith chemistry can be used on modular microfluidic microchips. The monoliths can be made using current technologies, porogens, and modifications to provide a selective separation matrix. The monoliths can be derivatized to have different surface chemistries and separation properties. After cleanup on modular microfluidic microchip, the samples can be transfer using a modular microfluidic interface to an analytical device or the analytical device can be on the microchip.

DNA Fragment Separations

On-chip capillary array electrophoresis with modular microfluidics can be used to separate DNA, RNA, proteins, or other analytes. These include PCR products, cDNA, RNA, single base extension reactions, VNTR, microsatellites, MLVAs and cycle sequencing products. The modular microfluidics provides a mechanism to load samples into a microchip from the top or the end when the sample has been prepared in small volume in a microchip or capillary, or if it has been prepared in larger volumes for analysis on a microchip. The CE separation can also be used as a first dimension in a multi-dimensional analysis or as a later dimension as described below.

Good separations in microchips are possible by systematic optimization of many parameters. A modified version of the Hjertén coating can prevent electroosmosis in the separation channels in glass. Separation matrices can be pumped into the microchip as described in the referenced patents incorporated herein by reference. For example, linear polyacrylamide such as MegaBACE Long Read Matrix performs well as will other formulation including 2% (w/w) high molecular mass (13 MDa) LPA with 0.5% low molecular mass (50 kDa) LPA; DMSO matrix separations; low viscosity POP matrices from Applera; and other matrices such as PVP can be used. For each design, the injection and separation voltage settings for the sample, waste, cathode and anode reservoirs can be tuned. Buffers can be adjusted to increase stacking, minimize injection plug size, provide sufficient ions for separations, and decrease evaporation.

DNA Sequencing on Modular Microfluidic Microchips

For DNA sequencing modular microfluidics can prepare and analyze sequencing samples with low consumable costs using automated preparation and analysis. PCR and cycle sequencing microchips can be disposable or reusable devices that are seamlessly integrated with a reusable sequence analysis microchip but could also feed existing conventional CAE instrumentation. By using nanofluidics, a modular microfluidic system can consume fewer reagents and will be less expensive to operate than conventional equipment. The modular approach will be scalable from clinical, research, or high throughput labs; serviceable; and readily extensible as improved microchips are developed.

A DNA sequencing system can be performed by first performing a DNA amplification step, such as the PCR amplification, rolling circle amplification, or other amplification step, as described above and then move the sample to a cleanup step for DNA, such as using biotinylated primers and beads with streptavidin, SPRI, chromatography, or other cleanup methods. The cleaned up sample is then moved either to a reservoir for capillary array electrophoresis off chip or into a twin tee injector for on chip electrophoresis.

Multi-Dimensional Separations

The modular microfluidic microchips facilitate multi-dimensional analysis. For a multi-dimensional analysis, the first separation dimension might be by free zone capillary electrophoresis and the second dimension by gel capillary electrophoresis. A first dimension of a gel separation on a modular microfluidic microchip could also be used to connect to an electrospray microchip that has a modular connection to receive the sample. The electrospray microchip might have connect to a spray nozzle or have the spray nozzle built into the modular microfluidic microchip. An alternative first dimension is capture onto an affinity material with antibodies, nucleic acids, aptamers, or other affinity materials.

For protein analysis, a two-dimensional separation can be performed by performing the first separation in an isoelectric focusing separation. Pressure is then applied to move the separated sample into an SDS denaturing gel electrophoresis separation. Alternatively, the sample can be released by altering the pH and then electric force used to move the now mobile separated proteins. A modular microchip could also prepare samples by ICAT or other labeling and then perform a first electrophoretic separation before docking with an electrospray MS for downstream analysis.

Similarly, for cell-based analysis, a series of modular microchips could labeled cells and introduce them into a flow cytometer or other readout device for analysis. Other combinations are possible and not meant to be excluded by these examples.

Integration of Sample Preparation, Cleanup, and Analysis

An advantage of the modular microfluidic microchips is that different steps can be developed individually with off-chip analysis, and then readily integrated into a more complex, multi-chip process using modular microfluidics to transfer samples or fluids. Samples such from cycle sequencing, PCR, cDNA, MLVA, proteins, or other samples can be prepared on a sample preparation microchip and then moved onto a second microchip by pressure, electrical, or other means into a channel or and collected in a reservoir. The samples can be further moved on the second microchip into a sample cleanup chamber and prepared as described. After cleanup samples can be eluted into the analysis portion, which can be a "Twin T" CAE system or into a MS or other analytical system. The integration can be by adjusting the workflow to accommodate the linkage of the sample preparation, cleanup, and analysis. This will involve optimizing the concentration of products made in the relevant reaction by changing the number of cycles, incubation times, or starting concentrations; matching the amount of fluid transferred to the concentration of products and elution volumes; and using a "Twin T" injector with sufficient volume to deliver high enough signal coupled with sufficient stacking or initial length to provide adequate resolution. An advantage of the modular microfluidic microchips is the different steps can be performed on different microchips as appropriate and match microchips with different throughputs.

Detection of Biodefense Agents and Emerging Infectious Diseases

In another application example, rapid detection and analysis of pathogenic organisms is a critical need for biodefense and for the management of emerging infectious diseases. Autonomous systems that can detect pathogens are required in the field while testing laboratories need automated systems that can rapidly detect and fingerprint microbes from human or environmental samples. Systems need to be developed that use advanced technologies including molecular detection, automation, microfluidics, and bioinformatics.

To create a detection monitor, a modular microfluidic microchip NanoBioSentinel instrument can be integrated with an upstream commercially available air sampler such as from Sceptor Industries (Kansas City) or other systems. The output from the air sampler can be lysed on a microchip using sonication, bead beating or other methods on a modular microfluidic microchip. The microchip can then output lysed and concentrated samples into a PCR chamber on a second microchip for on-chip analysis. Alternatively, the sample can be lysed off chip and the sample then feed to the PCR microchip. The PCR sample can be either read by real time PCR in the chamber or if labeled primers are used for multiplex detection, the samples can be separated on a modular microfluidic CAE microchip. Other detection chemistries including immunoassays, isothermal DNA amplification, and preparation of samples for mass spectroscopy are also possible.

Modular microfluidics can provide a platform to develop a biodefense detection system for multiple assays for both field and laboratory settings. In one embodiment, an autonomous air monitor could run a week and perform 336 tests at 30 min intervals or run for a month with 2 hr sampling intervals. For the first screen, the microchips might have up to 12 parallel reactions in a microchip with only one used each interval in low alert levels. The hotels might therefore need to hold at least 40 microchips.

FIG. 21 illustrates one embodiment of apparatus suitable to function as a modular microfluidic NanoBioSentinel system; the microfluidic shown are for example only and can, and usually will, be multiplexed. Three interacting microchips with microfluidic circuits are shown, each held individually on a stage. The middle microchip can slide with respect to the others. A fixed microchip is shown to provide valving and sealing functionality to microchip. Two microchip hotels hold disposable microchips while the microchip is reusable. This core technology platform will be applied to develop autonomous field monitoring equipment with multidimensional screening as well as a family of laboratory-based instruments.

As an example of how the NanoSentinel system could work for biodefense monitoring, samples from aerosol might be introduced into the modular microfluidic system. After lysis and concentration, the sample, from an air sampler, environmental, or clinical specimen, is moved for testing into microchip. The microchip could be capable of either ELISA or genetic screening, or a combination. PCR amplification with RT-PCR for ten target pathogens might be the primary screen performed on the microchip. If an optical detector senses amplification of a target PCR fragment, the ensuing process could be altered with real-time decision making via control software to trigger a second analysis specific for the putative agent such as fragment size analysis; invoke a MLVA, AFLP, or other assay; and begin a GenomiPhi archival amplification of the sample for subsequent testing. The assay could use microchips already in place or retrieve different microchips from the hotel(s). If the secondary screen is positive, a more complete characterization can be initiated with additional assays including short sequencing of pre-defined target regions while a response team arrives to manage the site and download archival material for further testing. Archival samples will consist of unprocessed fractions from the suspect samples and samples that have been GenomiPhi'ed using rolling circle amplification to amplify all the DNA in the sample. Because the systems can be remotely accessed and controlled, the flexible workflow can be used to adjust the sampling rate, focus on specific threats based upon intelligence or other incidents, or change the reporting threshold. In FIG. 21, four initial microchips from hotel 930 screens have been run before a secondary screen using a microchip from hotel was used. The first screen can also be ELISA based and the second PCR, or other combinations. The real-time decision making will allow tests to be only conducted when needed, saving assays and reducing costs until pre-defined trigger conditions occur. With web connections, the trigger conditions could be remotely controlled.

Modular microfluidics should have widespread applications in diagnostics for biodefense, infectious diseases, forensics, genomics, and proteomics. The technology will enable production of compact autonomous NanoSentinel units with small footprints that can be deployed to the field for biodefense applications such as pathogen monitoring devices for buildings, planes, or airports or as a laboratory version to cope with surges in testing demand. The Nano-BioSentinel system can prepare and analyze sample from air, biological fluids, agricultural products, or other matrices to detect target pathogens. The combination of low consumable costs with automated preparation and analysis should have a significant impact on molecular diagnostics.

VNTR Assay on Modular Microfluidic Microchips

VNTR analysis is a method that can be applied to determine the identity and subtype microorganisms. It has uses in epidemiology, biodefense, antibacterial development, medicine and other areas. VNTR can be readily adapted to modular microfluidic microchips. VNTR is based on PCR amplification with primer sets that robustly amplify multiple VNTR targets identified from bioinformatic databases. In modular microchips, the amplification will take place in the same or similar reaction chambers as for PCR reaction example described above. The amplified sets of products can be either removed from the microchip and analyzed on full scale analytical instruments such as capillary array electrophoresis and compared with full volume controls or the fragments analyzed on-chip using capillary electrophoresis on chip. The analysis is by moving the samples into the cross-channel injector and separated on-chip.

The VNTR analysis can be performed on a two chip system or on a three chip modular microfluidic microchip system with on-chip cleanup and analysis by fragment sizing. Without post-processing cleanup of the samples, the dye labeled primers will obscure part of the electropherogram.

MLVA on Modular Microfluidic Microchips

The VNTR assays can be extended to Multiple-Locus VNTR Analysis (MLVA). MLVA assays multiple VNTR alleles and provides a fingerprint of an organism. To adapt VNTR to MLVA and modular microfluidics, multiplexed PCR with sets of fluorescently labeled PCR primers is designed to target regions of either the chromosome or plasmids. Bioinformatics and experimental verification well known to one skilled in the art are applied to ensure primer sets do not interact or amplify regions of non-target organisms.

In the modular microfluidic system, the amplification would take place in the same chamber as the PCR described above. The amplified sets of products can be removed from the microchip and analyzed on CAE using denaturing linear polyacrylamide gel and compared with full volume controls. Alternatively MLVA samples can be prepared on one chip, captured on a second cleanup chamber, and analyzed on the third fragment analysis chip as described below.

AFLP on Modular Microfluidic Microchips

AFLP is a general fingerprinting technology that appears to be readily adaptable to a modular approach. To adapt ALFP to modular microchips, a restriction digest of lysed cells is first performed on-chip by pumping restriction enzymes and buffer into a chamber with the DNA to be analyzed. Restriction digests have previously been performed and analyzed on microchips. In addition, restriction digests on membranes have been transferred to microchip with the complete digestion and analysis complete within 20 min. The restricted sample can then have fluorescently labeled half-site adapters with two or three nucleotides added and ligated. Fluorescently-labeled PCR primers are added with PCR mix and PCR amplified. This could all occur on one microchip. The sample is the moved to a second microchip and separated by denaturing capillary gel electrophoresis. The fragments are detected by an external laser induced fluorescence detector using charge coupled devices (CCD) or photomultiplier tubes (PMT) or other detectors with laser illumination and appropriate filters. The patterns are analyzed for matches against reference libraries.

Eberwine Amplification

A standard method for amplifying RNA for microarray analysis is using the method commonly called the Eberwine amplification. The Eberwine procedure is a current standard method to linearly amplify RNA for analysis on a DNA microarray to measure global gene expression from total RNA. A transcription amplification using T7 RNA polymerase provides linear amplification which enables the detection of genes with low RNA expression levels.

In this method, after RNA isolation from a sample, first- and second-strand cDNA DNA is created from the RNA with reverse transcriptase using an oligo dT primer linked to a T7 promoter. The resultant DNA is then transcribed with a T7 RNA polymerase to perform a linear amplification that is representative of the original composition of the isolated RNA. The product of the Eberwine amplification is analyzed on DNA microarrays to measure the transcriptional profile of the gene expression of the sample.

The total process can take 18 hours and is a long temporal process even though the number of manipulation steps is few. The long time of the reactions has precluded the adaptation to microchips since, in a monolithic design, the other functions such as for analysis are limited in their throughput to the long incubation times.

Modular microfluidic microchips can alleviate the problems with adapting the Eberwine process to microchips. The Eberwine process can be performed in reaction chambers on modular microfluidic microchips. The long time can be accommodated by using multiple microchips in parallel. For analysis the prepared Eberwine samples for gene expression analysis are analyzed on full scale gene expression microarrays or in the future the measurements will be in microfabricated chambers on microchips.

Fraction Distribution and Collection

Modular microfluidic microchips can readily provide the functionality to rout samples by sliding the two microchips or using the jogging methods as described. When one microchip is performing a separation, the routing into another channel can be used to collect a fraction for additional sample preparation such as labeling or processing, or used to move a sample into another separation microchip for a multi-dimensional analysis, or used a fraction collector. For example, a first microchip could perform a separation and then the separated sample is then moved in fractions into multiple channels on a second microchip by pressure, capillary forces, electrical forces, or other means. The receiving microchip can also distribute the sample to more channels or for multiple analyses on a third microchip. The receiving channel could have short dimension such as a well and be loaded onto the top of a microchip or the end.

Constant Denaturant Gel Electrophoresis

Molecule differentiation methods such as denaturing gradient gel electrophoresis (DGGE), constant denaturant gel electrophoresis (CDGE), and single-strand conformation polymorphism (SSCP) offer the resolving power to identify regions of DNA with mutations compared to reference sequences.

CDCE sample preparation and separations can be performed on modular microchips. The samples can be PCR amplified on a modular microfluidic microchip. Samples from control and PCR amplified test organisms can be mixed together and by using a modular microfluidic interface introduced into a modular microfluidic microchip with multiple separation channels. The samples are separated in non-denaturing gel such as linear polyacrylamide in a range of denaturing conditions; the range can be produced by a heating device or chemical denaturants in the gel. The samples are then electrophoresed and hybrids with control and test strands that differ will be retarded. They can be detected by laser induced fluorescence and other means and then fractions can be collected by moving a receiving modular microfluidic microchip to collect the two homozygous sets of peaks and the heterozygous hybrids. The heterozygous can be further amplified, remixed with controls, and purified. Final analysis can be by DNA sequencing or genotyping methods.

In the future, the modular microfluidic system can be applied to other areas in chemical processing, chemical analysis, biodefense, pharmacogenetics, human medical genetics, biomedical research, animal and plant typing, and human identification.

Although this invention has been described in terms of certain preferred embodiments, other embodiments which will be apparent to those of ordinary skill in the art in view of the disclosure herein are also within the scope of this invention. Accordingly, the scope of the invention is intended to be defined only by reference to the appended claims. All documents cited herein are incorporated herein by reference in their entirety.

What is claimed is:

1. An integrated fluidic microchip system, comprising:

i) a plurality of fluidic microchips, each containing at least one capillary channel, each biased towards, and reversibly sealed to, at least one other of said microchips, creating an interface therebetween;

ii) means for linearly moving at least a first of said plurality of microchips with respect to at least a second microchip to which it is reversibly sealed, wherein at least one of the capillary channels in said first and/or second microchip can be connected or disconnected across the interface by the relative movement; and iii) means for reversibly segregating one or more of said microchips in fluidic discontinuity from all others of said plurality of microchips.

2. The system of claim 1, wherein an edge of said first microchip is reversibly sealed to an edge of said second microchip.

3. The system of claim 1, wherein an edge of said first microchip is reversibly sealed to a face of said second microchip.

4. The system of claim 1, wherein a face of said first microchip is sealed to a face of said second microchip.

5. The system of claim 1, wherein said linear motion is coaxial with the interface between said first and second reversibly sealed microchips.

6. The system of claim 1, wherein the reversible segregating means comprise at least one housing capable of maintaining said segregated microchips at a controlled temperature.

7. The system of claim 6, wherein the at least one housing is capable of maintaining said segregated microchips at a controlled humidity.

8. The system of claim 1, wherein the reversible segregating means comprise a plurality of housings, at least one being capable of maintaining segregated microchips at a controlled temperature or humidity level.

9. The system of claim 8, wherein each of the plurality of housings is capable of maintaining segregated microchips at a controlled temperature or humidity.

10. The system of claim 1, wherein said segregating means comprise means for sealing the ports of the chips segregated therein.

11. The system of claim 1, wherein said segregating means comprise means for reversibly engaging said microchip into said linear moving means.

12. The system of claim 1, wherein the linear moving means comprise means for reversibly engaging at least one microchip and means for moving said engaged microchip.

13. The system of claim 1, wherein at least one of said plurality of microchips is maintained in fixed position.

14. The system of claim 13, wherein said fixed microchip is connected to an external source of at least one of vacuum, pressure, electrical potential, and fluid reagents.

15. Apparatus for reversibly integrating a plurality of modular fluidic microchips, each containing at least one capillary channel, into a fluidically communicating system, the apparatus comprising:

means for reversibly biasing each of a plurality of microchips towards at least one other of the microchips with sufficient bias to create a reversible fluidically sealed interface therebetween;

means for linearly moving at least a first of the plurality of microchips with respect to at least a second microchip to which it is reversibly sealed, wherein at least one of the capillary channels in said first and/or second microchip can be connected or disconnected across the interface by the relative movement; and means for reversibly segregating one or more of the microchips in fluidic discontinuity from all others of the plurality of microchips.

16. The apparatus of claim 15, wherein the apparatus is capable of reversibly biasing a first fluidic microchip into fluidically sealed engagement with a second fluidic microchip.

17. The apparatus of claim 15, wherein the apparatus is capable of reversibly biasing a first fluidic microchip into fluidically sealed engagement with both a second and a third fluidic microchip.

18. The apparatus of claim 15, wherein the apparatus reversibly fixes one of the plurality of microchips into place.

19. The apparatus of claim 15, wherein the chip moving means are capable of moving at least one of the plurality of fluidic microchips coaxially with respect to its reversibly sealed interface with a second of the plurality of microchips.

20. The apparatus of claim 15, wherein the chip moving means are capable of moving at least one of the plurality of fluidic microchips orthogonally with respect to its reversibly sealed interface with a second of the plurality of microchips.

21. The apparatus of claim 20, wherein said orthogonal movement is along the z axis.

22. The apparatus of claim 15, wherein the apparatus further comprises fluid motivating means.

23. The apparatus of claim 15, wherein the apparatus further comprises detection means.

24. The apparatus of claim 23, wherein the detection means are optical detection means.

25. The apparatus of claim 15, wherein the apparatus segregating means comprise means for sealing the ports of the chips segregated therein.

26. The apparatus of claim 15, wherein the reversible segregating means comprise at least one housing capable of maintaining said segregated microchips at a controlled temperature.

27. The apparatus of claim 26, wherein the at least one housing is capable of maintaining said segregated microchips at a controlled humidity.

28. The apparatus of claim 15, wherein the reversible segregating means comprise a plurality of housings, at least one being capable of maintaining segregated microchips at a controlled temperature or humidity level.

29. A fluidic microchip, the chip comprising:

a fluid-impermeable substrate, the substrate having at least one capillary channel, the channel opening to at least one external surface of said substrate, wherein the at least one external surface is so fashioned as to make a reversible, fluidly sealed, engagement to a second fluidic microchip against which said microchip is reversibly biased, creating an interface therebetween, and wherein said at least one channel is capable of fluidly communicating with a capillary channel of said second microchip across said interface.

30. A method for integrating modular microchips to create microfluidic systems having changeable fluidic pathways, the method comprising:

reversibly biasing at least a first and second fluidic microchip into fluidly sealing engagement, creating an interface therebetween, each said microchip containing at least one capillary channel;

linearly moving at least a first of said plurality of microchips with respect to at least a second microchip to which it is reversibly sealed, wherein at least one of the capillary channels in said first and/or second microchip can be connected or disconnected across the interface by the relative movement; and segregating one or more of said microchips in fluidic discontinuity from all others of said plurality of microchips.

31. The method of claim 30, wherein the segregated microchip is segregated after a reaction has been commenced therein.

32. The method of claim 30, further comprising:

returning said at least one segregated microchip into fluid communication with at least one other of said plurality of fluidic microchips.

* * * * *